United States Patent
Yamazaki et al.

(10) Patent No.: US 7,123,332 B2
(45) Date of Patent: Oct. 17, 2006

(54) LIQUID CRYSTAL DISPLAY DEVICE, ELECTRONIC DEVICE HAVING THE SAME, AND SEMICONDUCTOR DEVICE

(75) Inventors: Shunpei Yamazaki, Tokyo (JP); Jun Koyama, Kanagawa (JP); Yasuyuki Arai, Kanagawa (JP); Yasuko Watanabe, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 146 days.

(21) Appl. No.: 10/839,754

(22) Filed: May 6, 2004

(65) Prior Publication Data

US 2005/0001968 A1 Jan. 6, 2005

(30) Foreign Application Priority Data

May 12, 2003 (JP) ............................. 2003-133631

(51) Int. Cl.
*G02F 1/136* (2006.01)
*G02F 1/1345* (2006.01)

(52) U.S. Cl. .................. 349/149; 349/42; 349/152; 345/104

(58) Field of Classification Search ............... 349/42, 349/149, 152; 345/104
See application file for complete search history.

(56) References Cited

U.S. PATENT DOCUMENTS

| 5,834,327 A | 11/1998 | Yamazaki et al. |
| 5,953,597 A | 9/1999 | Kusumoto et al. |
| 6,362,866 B1 | 3/2002 | Yamazaki et al. |
| 6,373,453 B1 * | 4/2002 | Yudasaka ..................... 345/76 |
| 6,618,111 B1 * | 9/2003 | Nagata et al. ............... 349/149 |
| 6,847,050 B1 | 1/2005 | Yamazaki et al. |
| 7,012,666 B1 * | 3/2006 | Morishita et al. ........... 349/149 |
| 2001/0038127 A1 | 11/2001 | Yamazaki et al. |
| 2002/0041355 A1 | 4/2002 | Yamazaki et al. |
| 2003/0035219 A1 | 2/2003 | Tanaka |
| 2003/0066740 A1 | 4/2003 | Inukai |
| 2003/0089690 A1 | 5/2003 | Yamazaki et al. |

FOREIGN PATENT DOCUMENTS

JP  11-160734  6/1999

* cited by examiner

*Primary Examiner*—Huyen Ngo
(74) *Attorney, Agent, or Firm*—Fish & Richardson P.C.

(57) ABSTRACT

A liquid crystal display device with improved productivity and a manufacturing method of the same. A liquid crystal display device according to the invention comprises in a region in which a scan line and a data line intersect with each other a first substrate comprising a first thin film transistor using either an amorphous semiconductor or an organic semiconductor for a channel portion, a second substrate, a liquid crystal layer interposed between the first substrate and the second substrate, and a third substrate comprising a second thin film transistor using a crystalline semiconductor for a channel portion. In the liquid crystal display device of the invention, a crystal grain boundary in the crystalline semiconductor extends along the flow of electrons or holes in the second thin film transistor, the first substrate is attached to the second substrate so that the first substrate is exposed, a first region for forming the second thin film transistor and a second region for forming an input terminal and an output terminal are formed on the third substrate, and the short side length of the third substrate is 1 to 6 mm and the short side length of the first region is 0.5 to 1 mm.

8 Claims, 21 Drawing Sheets longitudinal direction of grain boundary channel length direction scan line side data line side scanning direction of laser — one grade of circuit — pixel pitch B driver circuit forming region scanning direction of laser B driver circuit forming region beam length 0.75mm ← scanning direction of laser laser is not irradiated A: semicrystal region beam length 0.75mm B: crystal region A': semicrystal region

LIQUID CRYSTAL DISPLAY DEVICE, ELECTRONIC DEVICE HAVING THE SAME, AND SEMICONDUCTOR DEVICE

BACKGROUND OF THE INVENTION

1. Field of the Invention

The present invention relates to a liquid crystal display device (a semiconductor device) which comprises a display portion for displaying information such as images and text, and to a manufacturing method of the same. More particularly, the invention relates to a configuration of a driver circuit for transmitting a signal to each pixel of a pixel region forming a display portion, and to manufacturing and mounting methods of the same. Further, the invention relates to a liquid crystal display device (a semiconductor device) comprising a region in which semiconductor elements such as thin film transistors are arranged in matrix, and more specifically, to a configuration of a circuit formed in the periphery of this region, and manufacturing and mounting methods of the same.

2. Description of the Related Art

Among liquid crystal display devices comprising a liquid crystal layer, used is an active matrix display device comprising a pixel region in which thin film transistors (TFTs) are arranged in matrix for displaying information such as images. Such a display device has the advantage of reduced weight and thickness, therefore, it is used for various types of electronic apparatuses such as a notebook personal computer, a mobile computer, a mobile phone, and a liquid crystal television.

A technology for forming a channel portion by using an amorphous semiconductor provides improved productivity, since the amorphous semiconductor is capable of being formed on a relatively inexpensive and large sized substrate. However, in the case where a channel portion is formed of an amorphous semiconductor, the field effect mobility of a thin film transistor is approximately 1 $cm^2$/Vsec at most. Such a thin film transistor can be used as a switching TFT provided in a pixel region, but can not be used as an element forming a driver circuit which is required to operate at a high rate.

Accordingly, a driver circuit is mounted in the periphery of the pixel region by TAB (TCP) or COG by means of an IC chip formed on a single crystalline silicon substrate. In TAB, a driver IC having a bump in a pad portion is connected with alloy to a film circuit in which a circuit is formed of polyimide with copper foil by photolithography and then plated. The driver IC is sealed thereafter with resin and packaged. In COG, an IC chip is mounted on a substrate of a display device so as to be electrically connected to a wiring pattern which has been formed on the substrate.

When mounting a driver circuit by COG, a plurality of TFTs are formed of a non-monocrystalline semiconductor material on a substrate such as a glass substrate and a quartz substrate, and then divided into strip-shaped circuits. Afterwards, the strip-shaped driver circuits are mounted on another substrate (see Patent Document 1, for example).

[Patent Document 1] Japanese Patent Laid-Open No. H11-160734

SUMMARY OF THE INVENTION

The size of a circular silicon wafer gets progressively larger and the largest silicon wafer has a diameter of approximately 300 mm. However, there is a limit to the number of rectangular driver ICs which can be formed on the wafer. Further, the temperature coefficient of a silicon wafer which is a base of a conventional driver IC is different from that of a glass substrate. Therefore, deflection and the like are generated when attaching the silicon wafer to the glass substrate, leading to a defect such as increased contact resistance and a stress, and thus the reliability is decreased.

In view of the foregoing, the invention provides a liquid crystal display device with improved productivity and a manufacturing method thereof. To achieve this object, in the case of adopting TAB or COG, a plurality of semiconductor elements capable of operating at a high rate are formed on a rectangular glass substrate, and a plurality of driver ICs are formed by using the plurality of semiconductor elements.

To solve the aforementioned problems, the following measures are taken in the invention.

A liquid crystal display device according to the invention comprises a first substrate having a pixel region in which a thin film transistor is provided in each pixel, a second substrate having a counter electrode corresponding to the pixel region, and a third substrate having a scan line driver circuit or a data line driver circuit. Each of the scan line driver circuit and the data line driver circuit comprises a thin film transistor whose channel portion is formed of a crystalline semiconductor having a crystal grain boundary which extends parallel to the channel length. The thickness of a gate insulating layer of the thin film transistor is different between in the scan line driver circuit and in the data line driver circuit.

A liquid crystal display device according to the invention comprises a first substrate having a pixel region in which a first semiconductor element is disposed, a second substrate having a counter electrode corresponding to the pixel region, a third substrate which is disposed in the opposite side of the pixel region of the first substrate and has a plurality of second semiconductor elements formed of a crystalline semiconductor, and a liquid crystal layer interposed between the first substrate and the second substrate. The crystalline semiconductor comprises a crystal grain boundary which extends along the flow of electrons or holes in the plurality of second semiconductor elements. Each of the plurality of second semiconductor elements comprises a thin film transistor having a gate insulating layer of a first thickness and a thin film transistor having a gate insulating layer of a second thickness.

A liquid crystal display device according to the invention comprises a first substrate having a pixel region in which a first thin film transistor is disposed, a second substrate having a counter electrode corresponding to the pixel region, a third substrate which is disposed in the opposite side of the pixel region of the first substrate and has a plurality of second thin film transistors whose channel portion is formed of a crystalline semiconductor, and a liquid crystal layer interposed between the first substrate and the second substrate. The crystalline semiconductor comprises a crystal grain boundary which extends along electrons or holes flowing in the plurality of second thin film transistors. Each of the plurality of second thin film transistors comprises a thin film transistor having a gate insulating layer of a first thickness and a thin film transistor having a gate insulating layer of a second thickness.

A manufacturing method of a liquid crystal display device according to the invention comprises the steps of forming a pixel region in which a first semiconductor element formed of either an amorphous semiconductor or an organic semiconductor is disposed on a first substrate, forming a counter electrode corresponding to the pixel region on a second substrate, attaching the first substrate to the second substrate, forming a driver circuit in which a plurality of second semiconductor elements formed of a crystalline semiconductor are disposed on a third substrate and forming a plurality of driver ICs including an input terminal and an output terminal which are connected to the driver circuit, dividing the plurality of driver ICs into each driver IC, and attaching the driver IC to the periphery of the pixel region formed on the first substrate. The crystalline semiconductor is formed by irradiating continuous wave laser light.

In the liquid crystal display device according to the invention, the third substrate comprises a first region in which the crystalline semiconductor is formed and a second region in which the crystalline semiconductor is not formed. Further, the first region comprises the driver circuit and the second region comprises an input terminal and an output terminal.

In the liquid crystal display device according to the invention, the third substrate comprises a first region in which the crystalline semiconductor is formed and a second region in which the crystalline semiconductor is not formed. Further, the first region comprises the driver circuit and the second region comprises an input terminal and an output terminal. The short side length of the third substrate is in the range of 1 to 6 mm, and the short side length of the first region is in the range of 0.5 to 1 mm.

In the liquid crystal display device according to the invention, the short side length of the third substrate is in the range of 1 to 6 mm, and the input terminal and the output terminal provided on the third substrate are formed so as to have the same pitch as the pixel pitch. Further, the long side of the third substrate is as long as the short side or the long side of the pixel region.

In the liquid crystal display device according to the invention, the crystalline semiconductor is formed by irradiating laser light, and an oscillator generating the laser light is a continuous wave solid-state laser. More specifically, the oscillator is at least one kind of laser selected from among a YAG laser, a $YVO_4$ laser, a YLF laser, a $YAlO_3$ laser, a glass laser, a ruby laser, an alexandrite laser, and a Ti:sapphire laser of continuous wave. Otherwise, the oscillator is at least one kind of laser selected from among an excimer laser, an Ar laser, a Kr laser, and a $CO_2$ laser of continuous wave.

According to the invention, laser crystallization is performed by using a plurality of laser oscillators and a device including a diffractive optical element. Each laser light emitted from the plurality of laser oscillators is overlapped with each other so that the energy distribution is overlapped. The overlapped laser light provides a rectangular (top hat) distribution in the longitudinal direction by means of the diffractive optical element, and the laser crystallization in the invention is performed by using the laser light which shows such distribution. According to this, a crystalline semiconductor having few microcrystalline regions can be achieved.

By using a continuous wave laser emitted from the oscillator, a transistor can be formed of a polycrystalline semiconductor with reduced crystalline defects and a large grain size. Since such transistor has improved mobility and high response, a liquid crystal display device which is capable of operating at a higher rate and has elements with improved operating frequency can be obtained. Moreover, there are few variations in transistor characteristics, thus the reliability can be enhanced. In order to improve the operating frequency further, it is desirable that the channel length of a transistor have the same direction as the scan direction of laser light. This is because when the channel length of a transistor is substantially parallel (preferably in the range of −30° to 30°) to the scan direction of laser light relative to a substrate, the highest mobility can be achieved in a step of laser crystallization by a continuous wave laser. It is to be noted that the channel length is the direction of a current flow, that is, the direction in which charges are moved in the channel portion. Such a transistor has an active layer formed of a polycrystalline semiconductor whose crystal grain extends in the channel direction. In other words, a crystal grain boundary of the transistor is formed substantially parallel to the channel direction.

According to the invention, a driver IC is made up of semiconductor elements including such a crystalline semiconductor which is formed on a glass substrate and has good crystallinity. The crystalline semiconductor is desirably used for a register, a decoder, a counter, a dividing circuit, and a logical circuit forming a memory and the like, as well as a driver circuit such as a signal line driver circuit and a scan line driver circuit. It is to be noted that the width of a laser beam of laser light is preferably as long as the short side of a driver IC, thus, a liquid crystal display device with improved productivity can be provided as well as a manufacturing method thereof.

According to the invention, a driver circuit disposed in a data line side and that disposed in a scan line side are different in the thickness of thin film transistors. It is thus possible to independently operate the data line driver circuit and the scan line driver circuit. Specifically, the data line driver circuit operates at a driving voltage of 3 V and a frequency of 50 MHz or more (for example 65 MHz or more), therefore, the thickness of a gate insulating layer is set 20 to 70 nm and the channel length is set 0.3 to 1 μm. On the other hand, the scan line driver circuit operates at about a hundredth of a frequency of the data line driver circuit, namely about 100 kMHz. In this case, the thickness of a gate insulating layer is set 150 to 250 nm and the channel length is set 1 to 2 μm. In such a manner, driver ICs each having an operating frequency corresponding to each driver circuit can be achieved as well as a liquid crystal display device comprising the driver ICs.

As set forth above, the invention uses a thin film transistor having good characteristics, which is formed by irradiating laser light of a continuous wave laser, and therefore a liquid crystal display device provided with a driver IC capable of operating at a high rate can be achieved as well as a manufacturing method of the same. Also, since a plurality of driver ICs can be formed on a rectangular and large sized substrate, a low-cost liquid crystal display device and a manufacturing method of the same can be provided. Further, the driver IC of the invention is mounted by COG or TAB, therefore, a liquid crystal display device which is reduced in size, thickness, and weight with a narrow frame can be obtained as well as a manufacturing method of the same.

As set forth above, the invention uses a thin film transistor having good characteristics, which is formed by irradiating laser light of a continuous wave laser, and therefore a liquid crystal display device provided with a driver IC capable of operating at a high rate can be achieved as well as a manufacturing method of the same. Also, a liquid crystal display device with improved productivity can be provided as well as a manufacturing method of the same by setting the width of a laser beam of laser light as long as the short side of a driver IC. Further, since a plurality of driver ICs can be formed on a rectangular and large sized substrate, a low-cost liquid crystal display device and a manufacturing method of the same can be provided. Moreover, the driver IC of the invention is mounted by COG or TAB, therefore, a liquid crystal display device which is reduced in size, thickness, and weight with a narrow frame can be obtained as well as a manufacturing method of the same.

DETAILED DESCRIPTION OF THE INVENTION

Figure 1A:
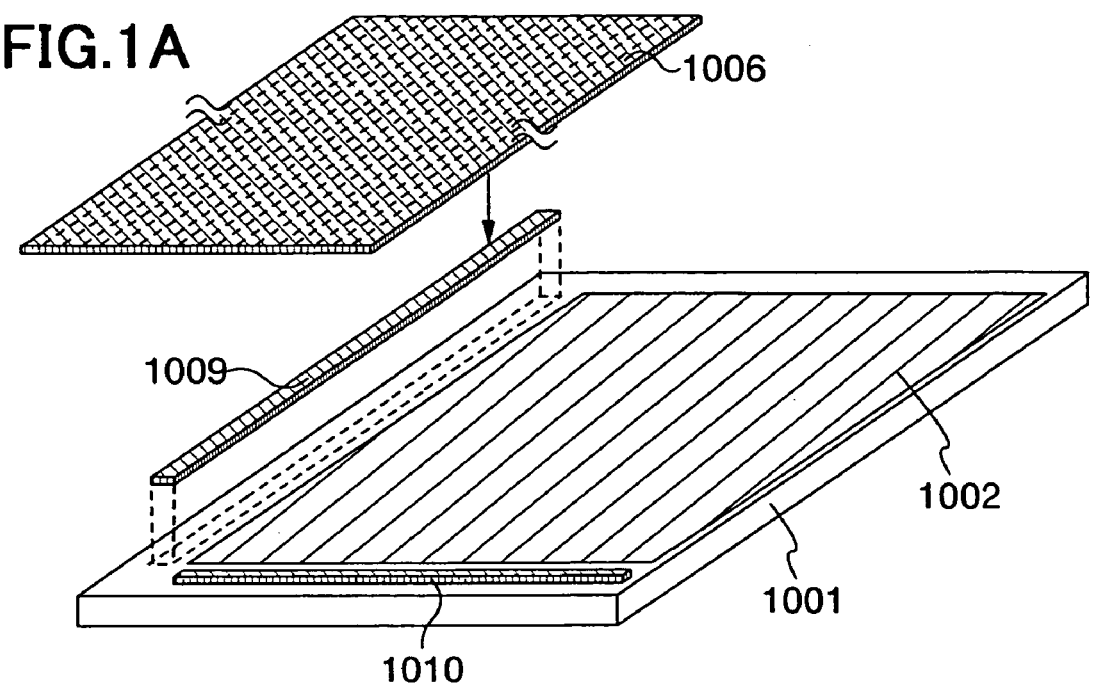
FIGS. 1A to 1E are diagrams showing a liquid crystal display device of the invention and a manufacturing method thereof.

Although the present invention will be described by way of embodiment modes and embodiments with reference to the accompanying drawings, it is to be understood that various changes and modifications will be apparent to those skilled in the art. Therefore, unless otherwise such changes and modifications depart from the scope of the invention, they should be construed as being included therein. It is to be noted that through the drawings described below, like components are denoted by the same reference numerals.

[Embodiment Mode 1]

With reference to a perspective view of FIG. 1A, a basic idea of the invention will be described. A pixel region 1002 for displaying information such as text and images is formed on a first substrate 1001. On a third substrate 1006, formed are a plurality of driver circuits and input and output terminals connected to the plurality of driver circuits. When the third substrate 1006 is separated into strips or rectangles making as a unit each driver circuit and an input terminal and an output terminal (input and output terminals) corresponding to the driver circuit, a plurality of driver ICs can be obtained. Then, the driver ICs are attached to the first substrate 1001 to complete a liquid crystal display device. In FIG. 1A, an example is shown in which a driver IC 1010 corresponding to a scan line driver circuit and a driver IC 1009 corresponding to a signal line driver circuit are mounted on the first substrate 1001. It is to be noted that the configuration of the driver ICs is preferably different between a scan line side and a signal line side.

Figure 1B:
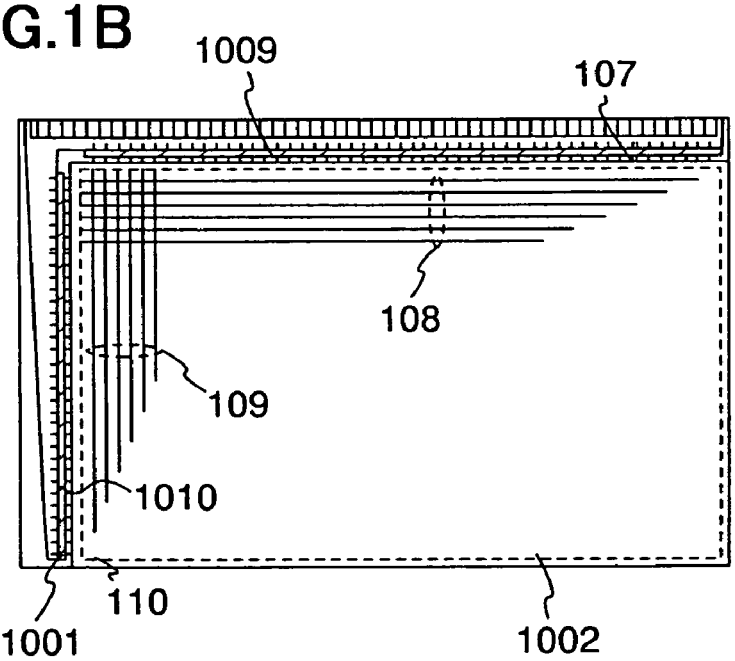

FIG. 1B is a top plan view of the liquid crystal display device in which the driver ICs are mounted and the input and output terminals of the driver ICs are electrically connected to the pixel region 1002. The pixel region 1002 is formed on the first substrate 1001, and a second substrate 110 comprising a counter electrode is formed on the pixel region 1002 with a liquid crystal layer interposed therebetween. In the case of forming the liquid crystal layer, the space between the first substrate 1001 and the second substrate 110 is controlled by a spacer, which is 3 to 8 μm when nematic liquid crystal is used, whereas 1 to 4 μm when smectic liquid crystal is used. It is desirable to use for the first substrate 1001 and the second substrate 110 a non-alkali glass such as an alumino borosilicate glass and a barium borosilicate glass. These substrates have a thickness of 0.3 to 1.1 mm (typically 0.7 mm), thus the thickness of the liquid crystal layer can be relatively thin enough to be ignored in appearance.

The pixel region 1002 comprises a scan line group 108 and a data line group 109 which intersect with each other to form a matrix, and a TFT is disposed in each intersection point. The structure of the TFT is not exclusively limited, though preferably used is a reverse staggered TFT using an amorphous silicon layer as an active layer. The amorphous silicon layer can be formed by plasma CVD at a temperature of 300° C. or less. For example, even when using a non-alkali glass substrate having an outer size of 550×650 mm, it takes only several tens of seconds to form the amorphous silicon layer having a thickness enough to form a TFT. Such a character is effective in manufacturing a display device with a large display screen.

The driver ICs 1009 and 1010 including driver circuits are mounted in the periphery of the pixel region 1002. The driver circuit 1009 is formed in the data line side and the driver circuit 1010 is formed in the scan line side. In order to form a pixel region corresponding to an RGB full color display, 3072 data lines and 768 scan lines are required in XGA, and 4800 data lines and 1200 scan lines are required in UXGA. In this embodiment mode, one side of the pixel region 1002 is set as long as the long side of the driver IC, therefore, it is preferable that the data lines and the scan lines have the same pitch as the output terminals of the driver ICs. According to this, it is not necessary to provide a lead wiring 107 for every few blocks at the end of the pixel region 1002, leading to improved yield in manufacturing steps. Moreover, the number of driver ICs to be mounted can be reduced, thus the reliability is enhanced.

When a plurality of such driver ICs are formed on the rectangular third substrate 1006, they can be produced in large quantities and the productivity is improved. Therefore, a large sized substrate, for example that having a side of about 300 to 1000 mm, is desirably used for the third substrate 1006. Then, a plurality of circuit patterns each including as a unit a driver circuit and input and output terminals are formed, and separated in the last step to complete the driver IC. The short side length of the driver IC is 1 to 6 mm and the long side length thereof is 10 to 60 mm.

According to the invention, these driver ICs are formed of a crystalline semiconductor, and the crystalline semiconductor is formed by irradiating continuous wave laser light. Therefore, as an oscillator generating the laser light, either a continuous wave solid-state laser or a continuous wave gas laser is used. Further in the invention, the spot width of laser light (specifically 1 to 6 mm) is set the same as the short side length of the driver IC or the short side length of the driver circuit in the driver IC. By adopting such a structure, at least one driver IC can be formed by scanning a laser beam of laser light once. Thus, a liquid crystal display device with improved productivity can be achieved as well as a manufacturing method of the same.

When irradiating continuous wave laser light, a crystal grain boundary extends in the scanning direction of the laser light. With such characteristics, a semiconductor layer is patterned so that the crystal grain boundary direction is parallel to the channel length direction. Thus, a thin film transistor using a crystalline semiconductor having enough electrical characteristics as an active layer can be achieved.

Figure 1C:
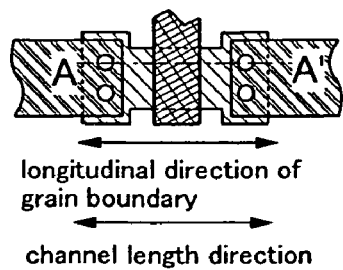

FIG. 1C is a top plan view of a thin film transistor mounted in the driver IC, which shows a patterning step for making the longitudinal direction of a crystal grain parallel to the channel length direction.

Figure 1D:
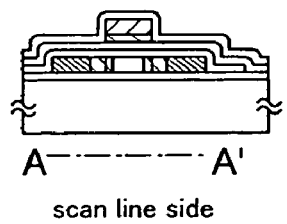
Figure 1E:
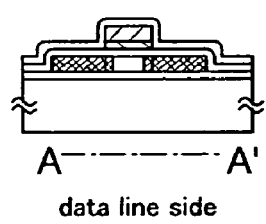

According to the invention, a driver circuit disposed in a data line side and that disposed in a scan line side are different in the thickness of a thin film transistor. FIGS. 1D and 1E show an example of cross sections of thin film transistors of a scan line driver circuit and a data line driver circuit, respectively. It is thus possible to independently operate the data line driver circuit and the scan line driver circuit. Specifically, the data line driver circuit operates at a driving voltage of 3 V and a frequency of 50 MHz or more (for example 65 MHz or more), therefore, the thickness of a gate insulating layer is set 20 to 70 nm and the channel length is set 0.3 to 1 μm. On the other hand, the scan line driver circuit operates at about a hundredth of a frequency of the data line driver circuit, namely about 100 kMHz. In this case, the thickness of a gate insulating layer is set 150 to 250 nm and the channel length is set 1 to 2 μm. In such a manner, driver ICs each having an operating frequency corresponding to each driver circuit can be achieved as well as a liquid crystal display device comprising the driver ICs.

It is to be noted that the driver IC is more advantageous than an IC chip in the length of the long side. By using a driver IC having a long side length of 15 to 80 mm, the number of driver ICs to be mounted corresponding to a pixel region can be reduced as compared with in the case of using the IC chip, leading to improved productive yield. Furthermore, since the driver IC is formed on a glass substrate in the invention, the form of a substrate used as a base is not restricted and the productivity is not reduced. This provides a great advantage as compared with the case where the IC chips are formed on a circular silicon wafer.

Figure 2A:
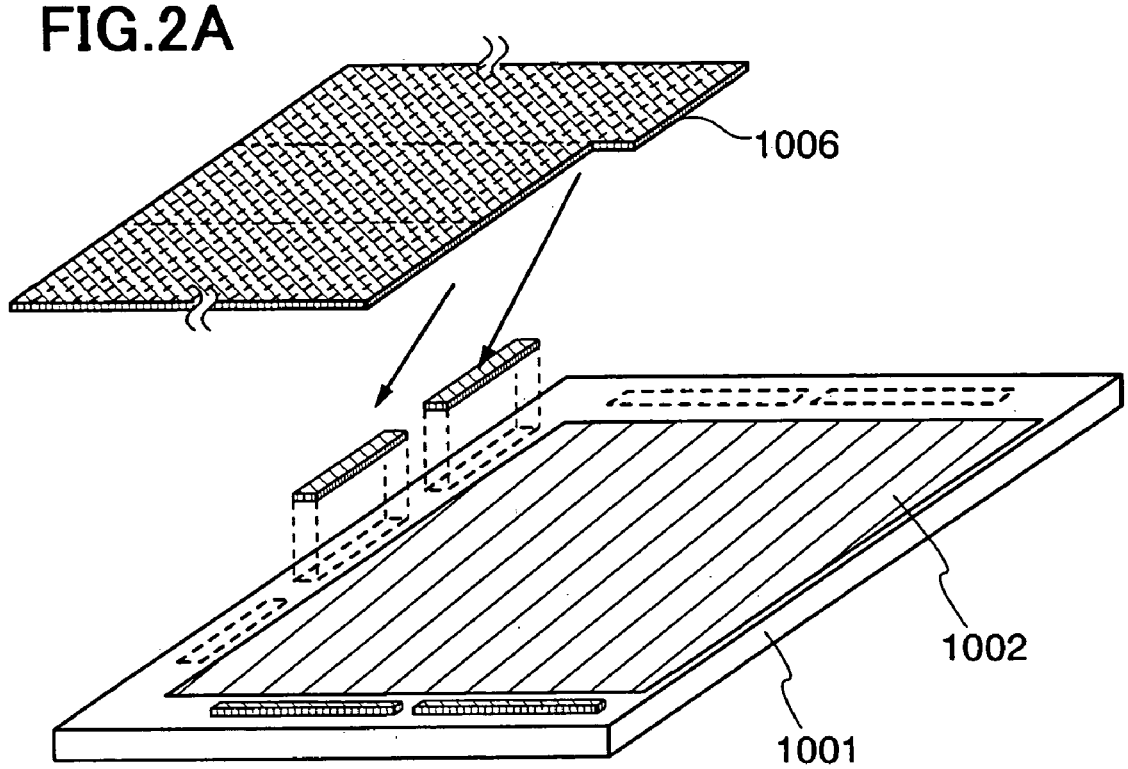
FIGS. 2A and 2B are diagrams showing a liquid crystal display device of the invention and a manufacturing method thereof.
Figure 2B:
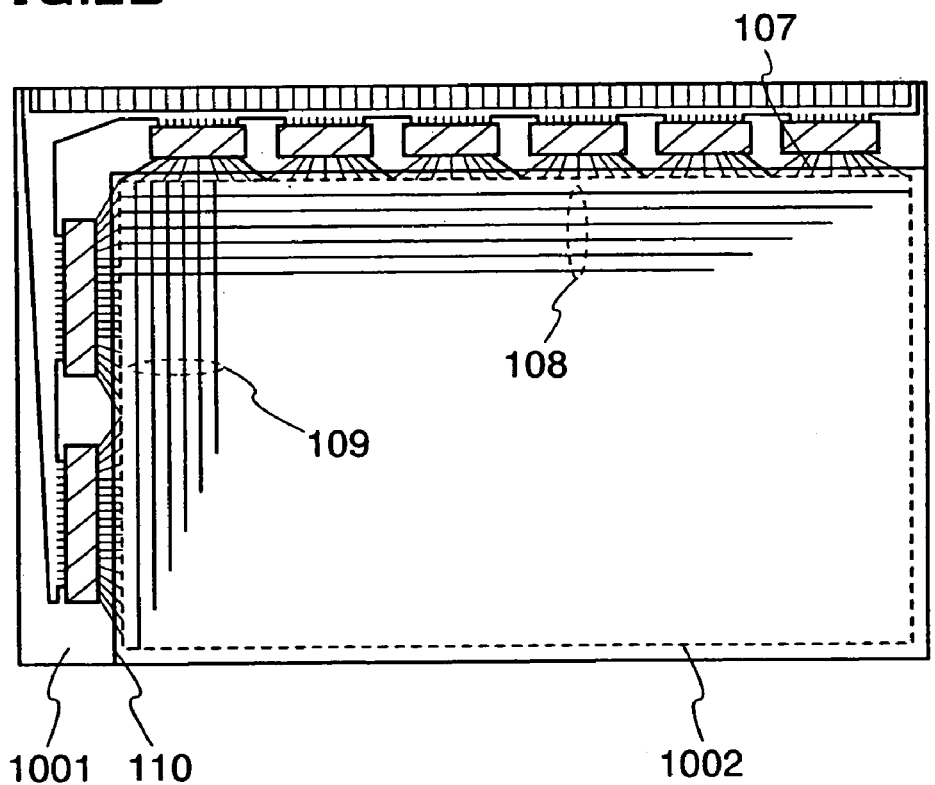

A dividing method of driver circuits formed on the third substrate 1006 is not exclusively limited. As shown in FIG. 2A, the driver circuits may be separated in the lateral and longitudinal directions to take out a plurality of driver ICs from the third substrate 1006. Then, several driver ICs may be attached to each of the data line side and the scan line side as shown in FIG. 2B.

Figure 5A:
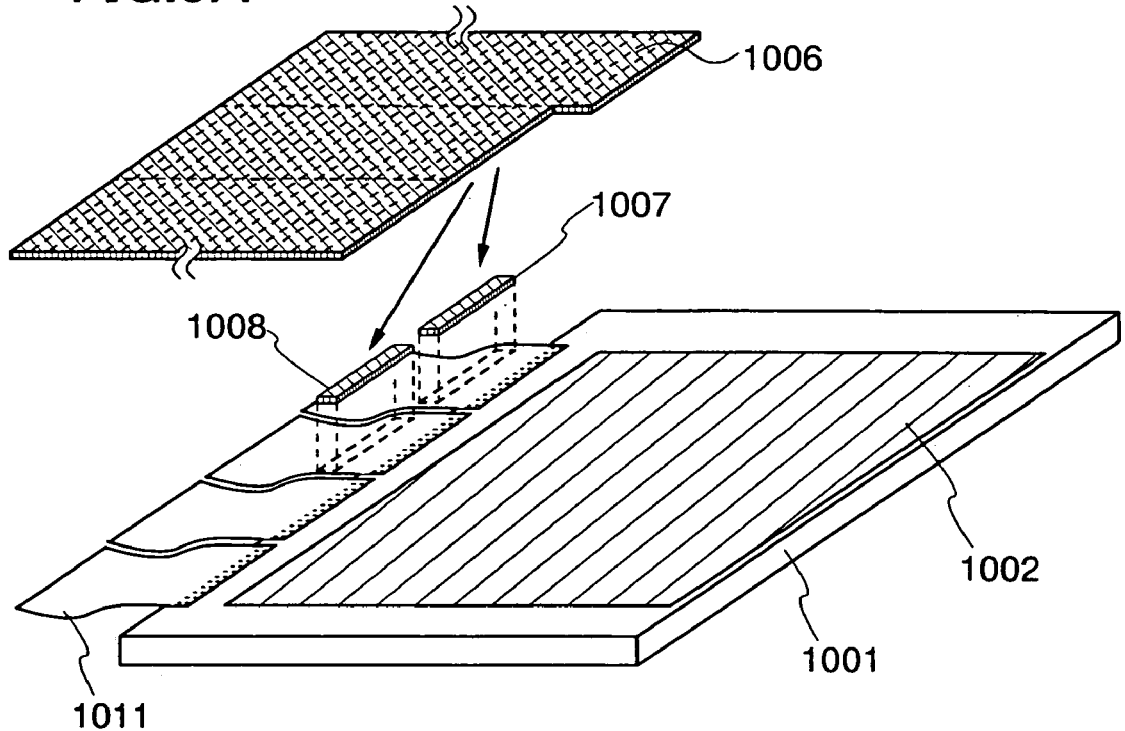
FIGS. 5A and 5B are diagrams showing a liquid crystal display device of the invention and a manufacturing method thereof.
Figure 5B:
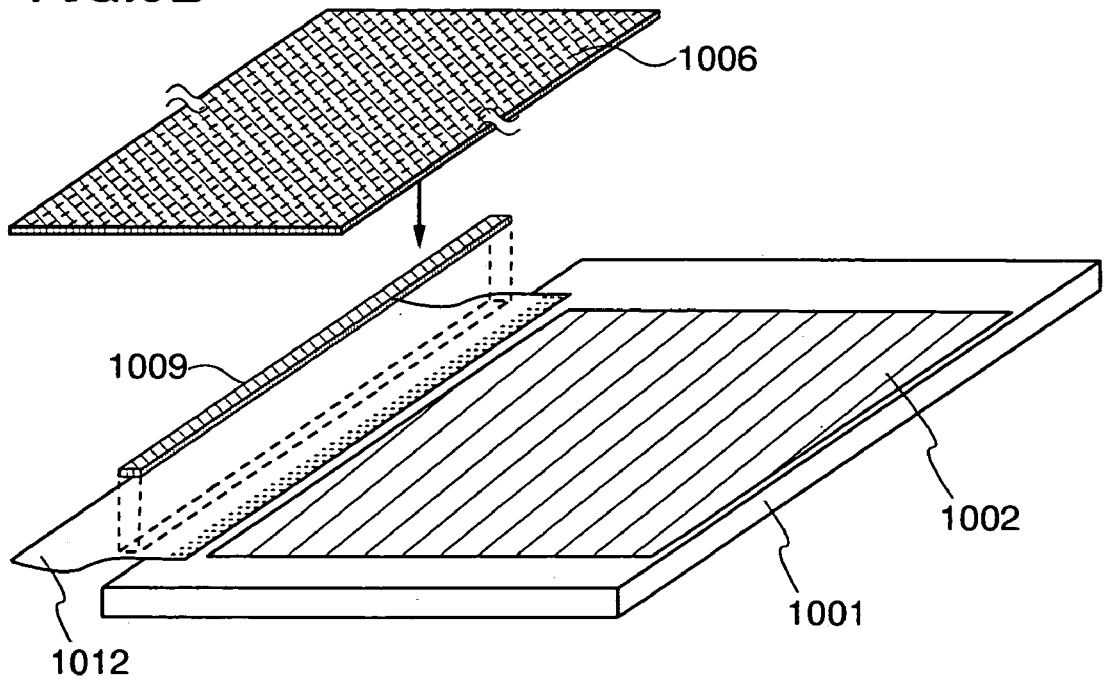

Although a liquid crystal display device using COG is shown in FIGS. 1A to 1E and FIGS. 2A and 2B, the invention can be applied to a liquid crystal display device using TAB. With reference to FIGS. 5A and 5B, a liquid crystal display device using TAB is described hereinafter. When using TAB, a wiring electrically connected to the pixel region 1002 is exposed, an FPC is connected to the exposed wiring, and driver ICs 1007 to 1009 are attached to the FPC. In FIG. 5A, a plurality of FPCs 1011 are provided and the driver ICs 1007 and 1008 are attached to the FPCs 1011. In FIG. 5B, one driver IC 1009 is attached to one FPC 1012. In the latter case, a piece of metal may be provided with the driver IC 1009 in order to add the strength thereof.

An example of conditions for driving the driver IC is as following: a power supply voltage VDD is 0.5 to 30 V, VDD−VEE is −0.5 to 28 V, and VEE is −17 to 0.5 V, an input voltage is VEE −0.5 to VDD +0.5 V, an input current is ±10 mA, and an output current is ±10 mA.

[Embodiment Mode 2]

Embodiment mode of the invention will be described with reference to accompanying drawings.

Figure 3A:
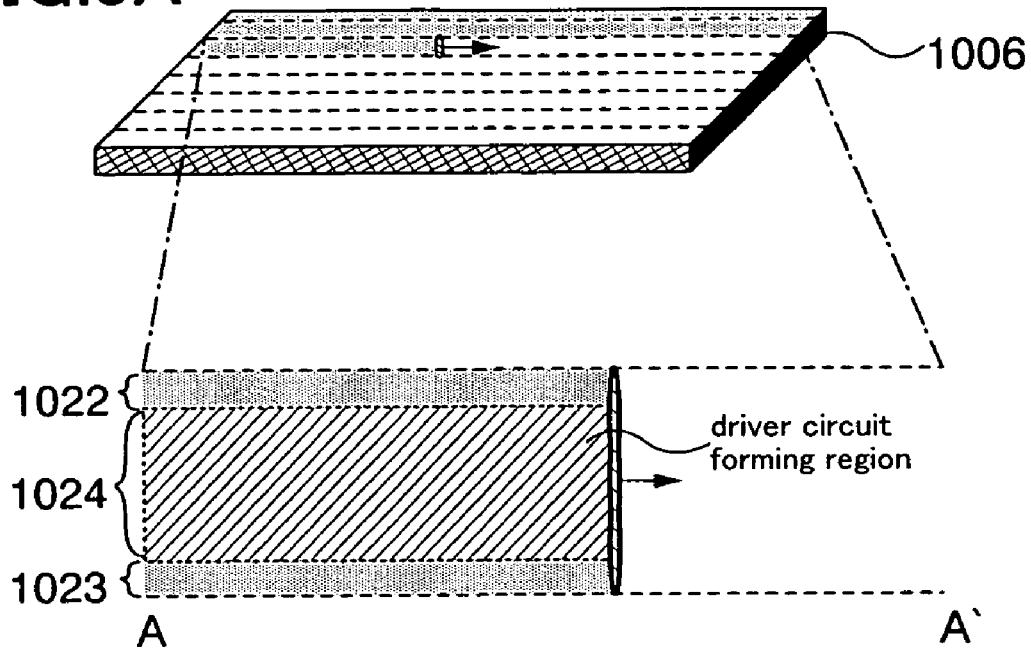
FIGS. 3A to 3C are diagrams showing a driver IC.

In order to form a driver IC of the invention, an amorphous semiconductor is formed on a strip-shaped substrate, and the amorphous semiconductor is crystallized by irradiating continuous wave laser light to obtain a crystalline semiconductor. With reference to FIG. 3A, explanation is made on a method for irradiating laser light to an amorphous semiconductor formed on the third substrate 1006. According to the invention, the spot width of laser light (specifically 1 to 6 mm) is set the same as the short side of a driver IC or the short side of a driver circuit disposed in the driver IC. Thus, a plurality of driver ICs having the short side length of 1 to 6 mm can be formed by using a crystalline semiconductor formed on the third substrate 1006. Since these driver ICs are divided along processing lines by a glass scriber and separated from the third substrate 1006, each driver IC in a group is disposed on the substrate 1006 so as to have a margin of 0.5 to 1 mm. In such a manner, when using a glass substrate having a size of 300×400 mm employed by a first generation liquid crystal substrate, for example, 360 driver ICs of 2×20 mm in size can be formed in a group having a size of 127×127 mm, and thus 2160 driver ICs can be taken out from one substrate.

With reference to FIG. 3A, explanation will be hereinafter made on a method for irradiating laser light to the amorphous semiconductor on the third substrate 1006 to form a crystalline semiconductor. In general, energy density of spotted laser light has a distribution in which the energy density is progressively decreased from the center to the edges of the spotted laser light. Accordingly, a semiconductor irradiated with the center of the spotted laser light is well crystallized and exhibits excellent electrical characteristics. Meanwhile, in the case where a semiconductor is irradiated with the edges of the spotted laser light, since the energy density of the laser light is not sufficient, the semiconductor is not dissolved adequately and microcrystallized. The semiconductor formed in such a region can not have sufficient electrical characteristics, and thus not be used as an active layer.

Figure 3B:
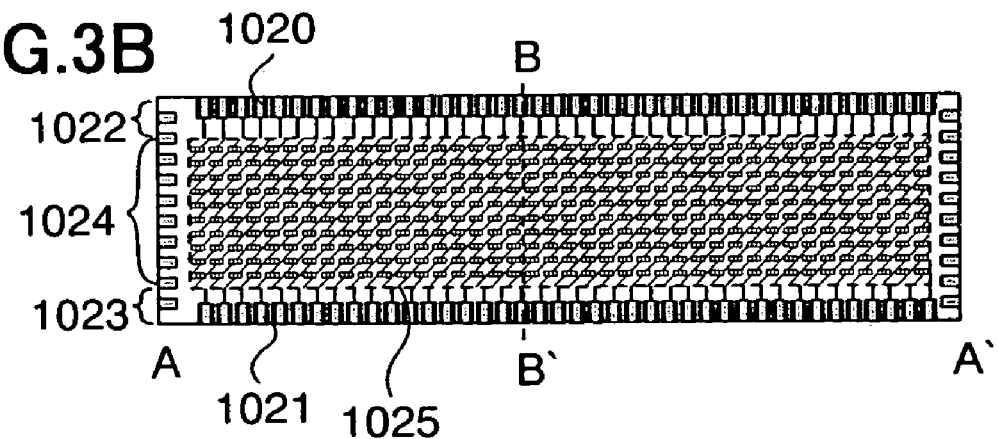

As shown in FIG. 3B, a region irradiated with the center of the laser light having high energy density is denoted by 1024, and other regions are denoted by 1022 and 1023. A driver circuit 1025 is formed of a crystalline semiconductor having excellent crystallinity which is formed in the region 1024. Then, semiconductors formed in the regions 1022 and 1023 are removed, and an input terminal 1020 and an output terminal 1021 are formed in these regions. It is to be noted that the short side length of the region 1024 is about 0.5 to 1 mm. That is, the short side length of the driver circuit is much the same as the length of the high energy region. Thus, the driver circuit 1025 is formed of a crystalline semiconductor having good crystallinity, which can be formed at the center of the spotted laser light.

A channel portion and a source and drain region of a transistor included in the driver circuit 1025 are formed of a crystalline semiconductor, and the crystalline semiconductor is obtained by irradiating continuous wave laser light. In the case of patterning the crystalline semiconductor, all the thin film transistors are patterned so as to have the same channel length directions. In such a patterned thin film transistor, a crystal grain boundary extends in the direction in which electrons or holes flow (that is, the channel length direction), therefore, the thin film transistor can operate at a higher rate.

Figure 3C:
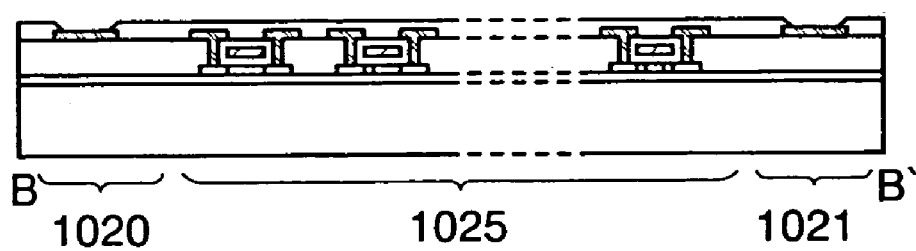

FIG. 3C is a cross sectional view taken by cutting along a line B–B' in FIG. 3B. A plurality of output terminals 1021 connected to a signal line or a scan line in a pixel region are formed at a pitch of 40 to 100 μm. Similarly, the input terminals 1020 are provided in required quantities. These input terminals 1020 and output terminals 1021 are formed in squares or rectangles having a side of 30 to 100 μm.

Figure 4A:
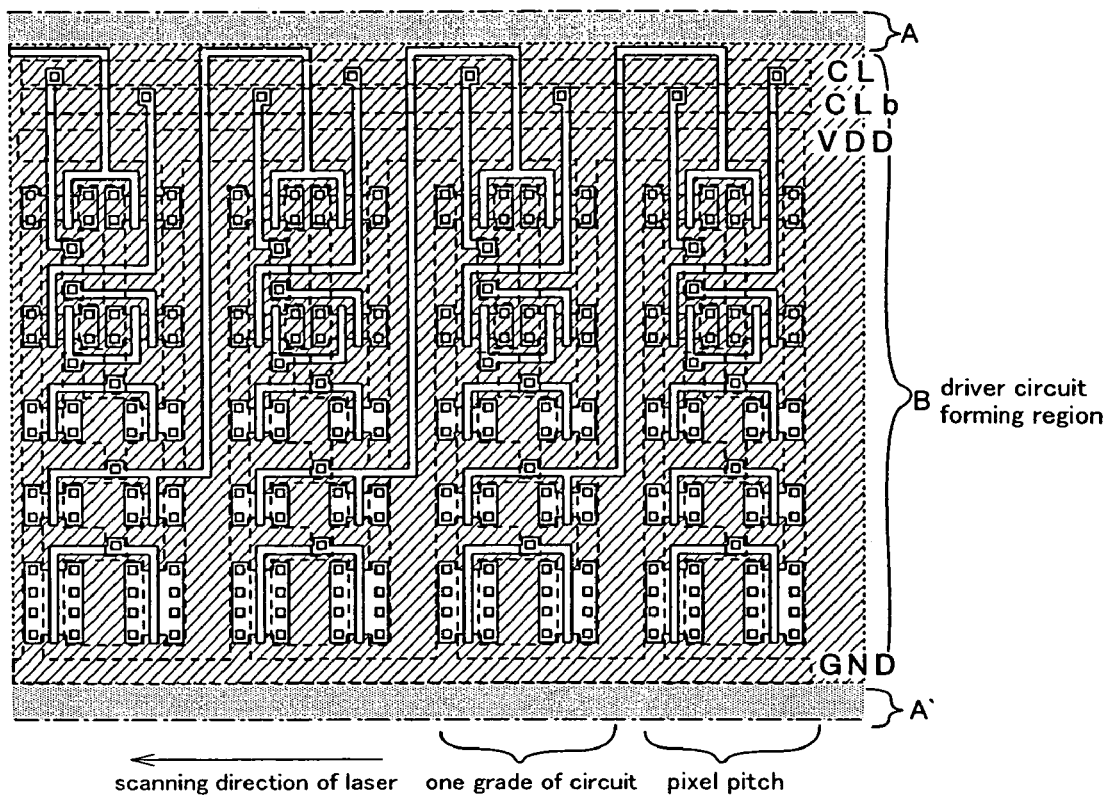
FIGS. 4A and 4B are diagrams showing a mask layout of a shift register.
Figure 4B:
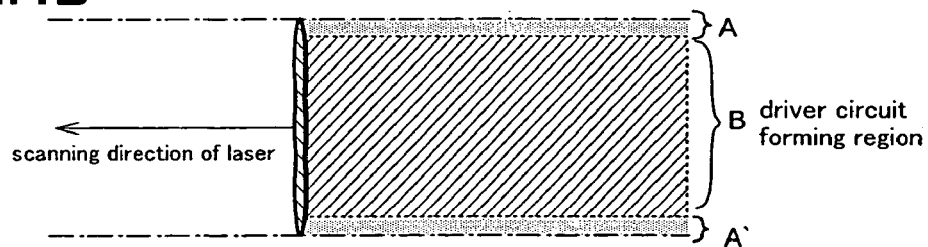

As an example of the driver circuit 1025, a shift register which is made up of a plurality of transistors is formed, and a mask layout thereof is shown in FIGS. 4A and 4B. In the shift register, a single stage of circuits are sequentially connected to each other, and signals CK and CKB are alternately inputted to each stage of circuits. A single stage of circuits corresponds to a column of pixels in a plurality of pixels arranged in matrix. Therefore, the short side length of a single stage is preferably set the same as the pixel pitch. According to this, the pitch of the output terminals of the driver IC can be set the same as the pitch of the scan line or the data line. By adopting this structure, it is no longer required to provide a lead wiring for every few blocks at the end of the pixel region, and thus the productive yield can be enhanced.

It is to be noted that exposure has to be performed effectively in order to form a lot of driver ICs on a large sized substrate. A design rule for the driver IC is in the range of 0.3 to 2 μm, preferably 0.35 to 1 μm. When forming the driver IC, it is necessary to perform exposure with enhanced throughput by adopting such a design rule. As for a exposure method, a proximity method and a projection method are effective in increasing the throughput, but they have the disadvantage that a large sized mask with high precision is required and high resolution and precise alignment are difficult to realize. On the other hand, with a step method, an i-line (365 nm) is used and 44×44 mm regions or 54×30 mm regions can be exposed all at once at a resolution of 0.7 μm, for example. When the long side length of the driver IC is made to be within this exposure range, it is possible to perform exposure with good efficiency even with a sub-micron pattern.

[Embodiment Mode 3]

In this embodiment mode, laser crystallization using continuous wave laser light will be described.

A continuous wave laser suitable for the process is one having a wavelength of 550 nm or less and having highly stable power. For example, the second harmonic of a Nd:YVO$_4$ laser, the second harmonic of a Nd: YAG laser, the second harmonic of a Nd: YLF laser, the second harmonic of a Nd:glass laser, the second harmonic of a Nd:YAlO$_3$ laser, an Ar laser and the like meet the requirement. The third or higher harmonic of these lasers may also be used. Alternatively, a ruby laser, an alexandrite laser, a Ti:sapphire laser, a continuous wave excimer laser, a Kr laser, a CO$_2$ laser, a continuous wave helium cadmium laser, a copper steam laser, a gold steam laser and the like may be used. It is also possible to employ plural lasers of one type or different types selected from those lasers.

According to the invention, laser beams emitted from a plurality of laser oscillators are overlapped with each other. In general, energy density of laser light has a distribution in which the energy density is progressively decreased from the center to the edges of the laser light. In the invention, a plurality of laser beams are overlapped with each other so as to overlap their energy density. In addition to this structure, a diffractive optical element is utilized in order to obtain a linear beam having a length of 0.5 to 1 mm and having a profile whose longitudinal direction is rectangular (top hat) in shape.

To perform laser crystallization with overlapped laser beams as set forth above, used is a device comprising a plurality of laser oscillators, a λ/2 wavelength plate, a mirror, a polarizer, a homogenizer including a diffractive optical element and the like, a zoom system including a cylindrical lens and the like, an optical collection system and the like.

Each laser beam emitted from the plurality of laser oscillators has the same polarization direction. Therefore, one or some of the laser beams transmit the λ/2 wavelength plate, thereby turning the polarization direction by 90 degrees. The polarizer allows a plurality of laser beams to be overlapped with each other. The overlapped laser beams are formed into a linear beam through the homogenizer and the like, and the linear beam is irradiated to an amorphous semiconductor on a substrate.

Figure 6A:
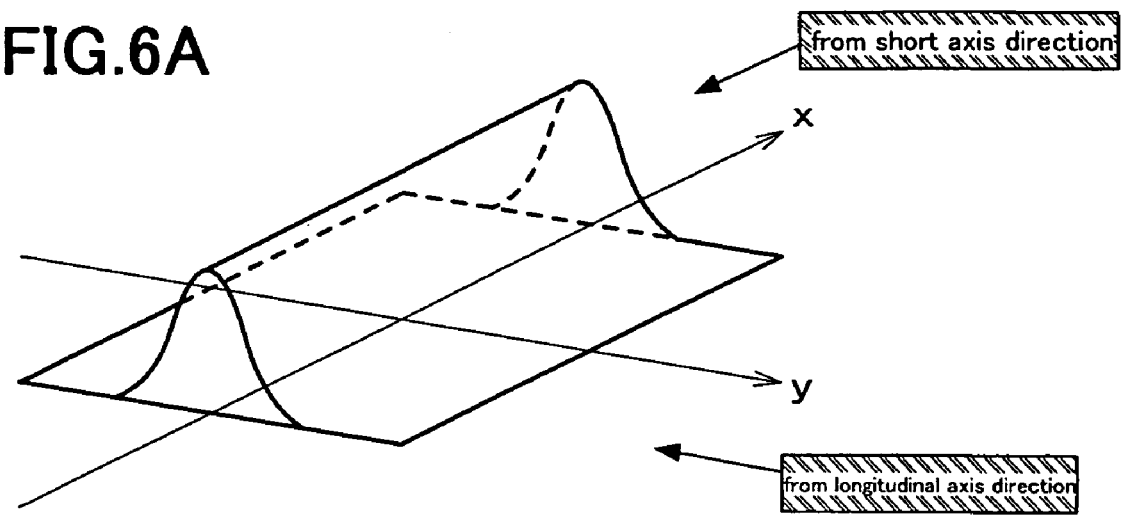
FIGS. 6A to 6C are diagrams showing a profile of a liner beam.
Figure 6B:
Figure 6C:

A beam profile at the irradiated surface is shown in FIGS. 6A to 6C. FIG. 6A is a perspective view, which is rectangular in shape viewed from the longitudinal direction (FIG. 6B) and which has a gaussian-like profile viewed from the lateral direction (FIG. 6C). The homogenizer comprising a diffractive optical element allows the longitudinal direction of the profile to be rectangular.

In order to crystallize a semiconductor film on a substrate, the linear beam is scanned in the direction perpendicular to the longitudinal direction while moving to the longitudinal direction at a suitable irradiation rate. This scanning is performed with the laser oscillators and optical system (λ/2 wavelength plate, mirror, polarizer, homogenizer, zoom system, and optical collection system) fixed, while moving a substrate so that the linear beam is scanned on the substrate by the means of an X-Y stage.

Figure 21A:
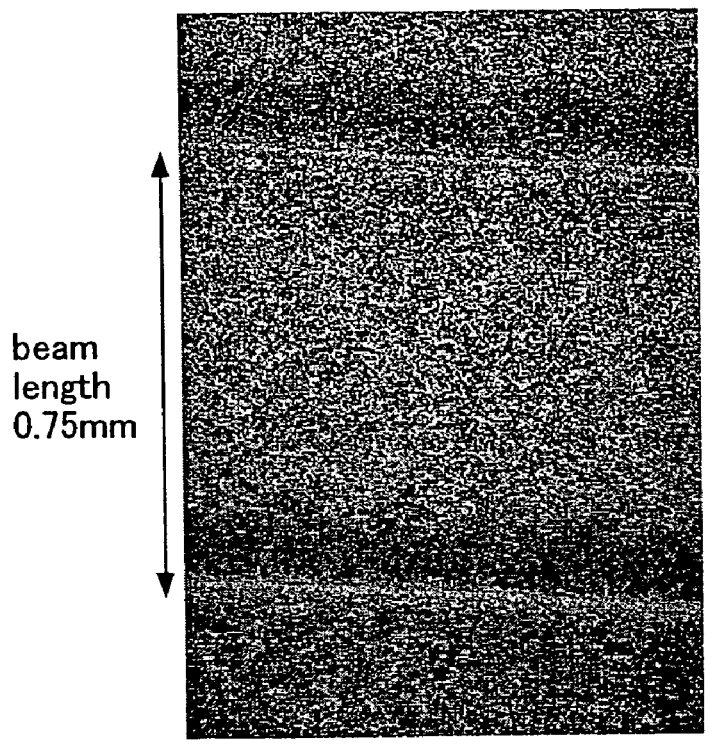
FIG. 21A is a photograph of a crystalline semiconductor and FIG. 21B is a pattern diagram of the same.
Figure 21B:
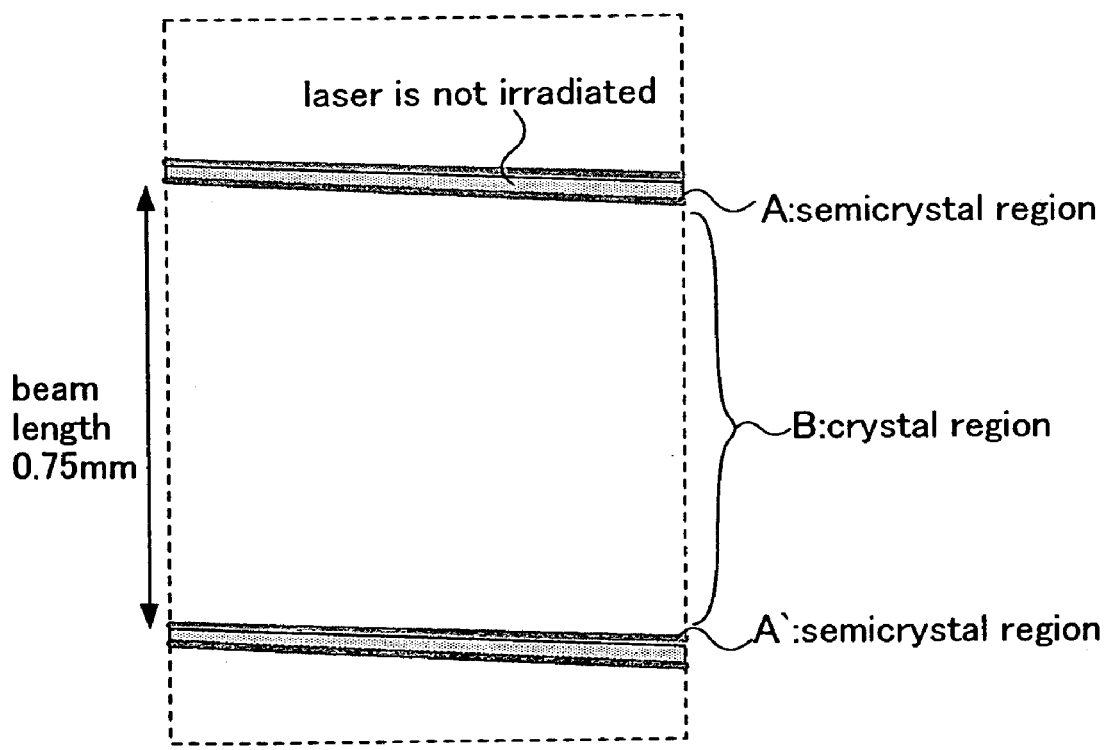

FIG. 21A is a photograph of a crystalline semiconductor crystallized by laser irradiation using the aforementioned optical system and the YVO$_4$ laser, and FIG. 21B is a pattern diagram of the photograph. The laser crystallization is performed with a power of 14.4 W, a scanning rate of 35 cm/sec, and a beam length of 0.75 mm. FIGS. 21A and 21B show that a crystalline semiconductor having excellent crystallinity and few microcrystalline regions can be achieved by using the optical system described above.

According to the invention, laser crystallization is performed by using a plurality of laser oscillators and a device comprising a diffractive optical element. Moreover, laser beams emitted from the plurality of laser oscillators are overlapped with each other so that the energy density is overlapped. The overlapped laser beams have a rectangular (top hat) profile in the longitudinal direction due to the diffractive optical element. One feature of the invention is that laser crystallization is performed by means of the laser beam having such a profile. According to this, a crystalline semiconductor having few microcrystalline regions can be obtained.

This embodiment mode can be implemented in combination with other embodiment modes.

[Embodiment 1]

In this embodiment, manufacturing steps of a thin film transistor by using continuous wave laser will be explained with reference to FIGS. 7 to 9.

Figure 7A:
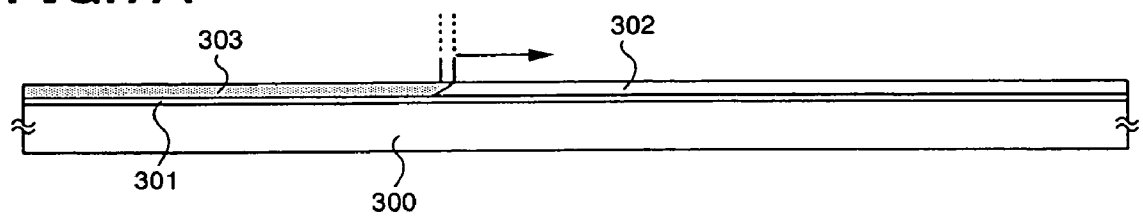
FIGS. 7A and 7B are diagrams showing a manufacturing method of a liquid crystal display device of the invention.
Figure 7B:
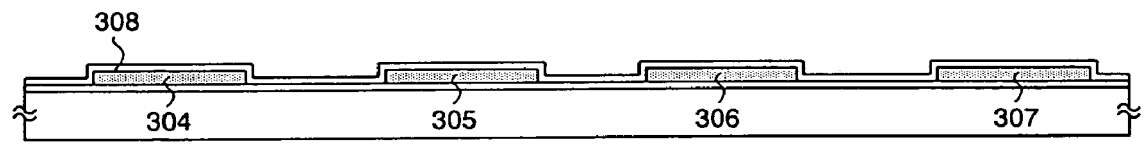

First, a base layer 301 is formed on a substrate 300 (FIG. 7A). The substrate 300 can be formed of, for example, a glass substrate such as of a barium borosilicate glass and an alumino borosilicate glass, a quartz substrate, an SUS substrate (stainless substrate) and the like. A flexible substrate such as a plastic substrate formed of synthetic resin has generally lower heat resistance as compared with the aforementioned substrates. However, it may be employed as long as it is capable of withstanding heat treatment during manufacturing steps.

The base layer 301 serves to prevent alkali metal such as Na and alkaline-earth metal which are included in the substrate 300 from diffusing into a semiconductor and adversely affecting characteristics of semiconductor element. Therefore, the base layer 301 is formed of an insulating film such as a silicon oxide film, a silicon nitride film, and a silicon nitride oxide film, which can inhibit the diffusion of alkali metal and alkaline-earth metal into the semiconductor. In this embodiment, a silicon nitride oxide film is deposited by plasma CVD so as to have a thickness of 10 to 400 nm.

It is to be noted that the base layer 301 may be of a single layer or laminated layers of insulating films. Further, in the case of using a substrate such as a glass substrate, a SUS substrate, and a plastic substrate, which includes more or less alkali metal or alkaline-earth metal, the base layer is useful in view of preventing the diffusion of impurities. However, it is not necessarily provided when using a quartz substrate and the like containing insignificant amount of impurities.

Subsequently, a semiconductor 302 is formed on the base layer 301 so as to have a thickness of 25 to 100 nm (preferably 30 to 60 nm). For the semiconductor 302, a silicon film or a germanium silicon film is used. Afterwards, heat treatment is performed at a temperature of 500° C. for one hour to exhaust hydrogen.

Next, the amorphous semiconductor 302 is crystallized by means of a laser irradiation system in order to form a crystalline semiconductor 303. In this case, it is possible to obtain a crystal with a large grain size when second to fourth harmonics of a fundamental harmonic are used with a continuous wave solid-state laser. Typically, it is preferable to use the second harmonic (532 nm) or the third harmonic (355 nm) of a Nd:YVO$_4$ laser (fundamental harmonic: 1064 nm). More specifically, laser light emitted from a continuous wave YVO$_4$ laser is converted to the harmonic with a non-linear optical element to obtain laser light having an output of 10 W. Further, a YVO$_4$ crystal and a non-linear optical element may be put in an oscillator to emit a harmonic. More preferably, the laser light is formed so as to have a rectangular shape or an elliptical shape by an optical system, and irradiated on a surface of the amorphous semiconductor 302. At this time, an energy density of approximately 0.01 to 100 MW/cm$^2$ (preferably 0.1 to 10 MW/cm$^2$) is required. The amorphous semiconductor is irradiated with the laser light by moving relative to the laser light at approximately 10 to 2000 cm/s rate.

The crystalline semiconductor 303 obtained in this manner is patterned into the desired shapes to form semiconductor layers 304 to 307. Then, a gate insulating layer 308 is formed so as to cover the semiconductor layers 304 to 307. As the gate insulating layer 308, for example an insulating film containing silicon is formed by sputtering so as to have a thickness of 30 to 200 nm.

Another manufacturing method of a crystalline semiconductor will be explained with reference to FIGS. 8A to 8D. This method is the same as the aforementioned method up to the step for forming the amorphous semiconductor 302, and the explanation thereof is thus omitted.

In this method, a nickel acetate salt solution 310 containing Ni of 1 to 100 ppm by weight is coated on a surface of the amorphous semiconductor 302 by a spinner. It is to be noted that a catalyst element may be applied in other ways such as sputtering, evaporation, and plasma processing.

Subsequently, heat treatment is performed at a temperature of 400 to 650° C. for 4 to 24 hours, for example, at 550° C. for 14 hours. With this heat treatment, crystallization proceeds vertically from the surface coated with the nickel acetate salt solution toward the substrate 300, and thus a crystalline semiconductor is obtained. Although nickel (Ni) is used as a catalytic element here, other elements, such as germanium (Ge), iron (Fe), palladium (Pd), tin (Sn), lead (Pb), cobalt (Co), platinum (Pt), copper (Cu), and gold (Au), may also be used.

Figure 8A:
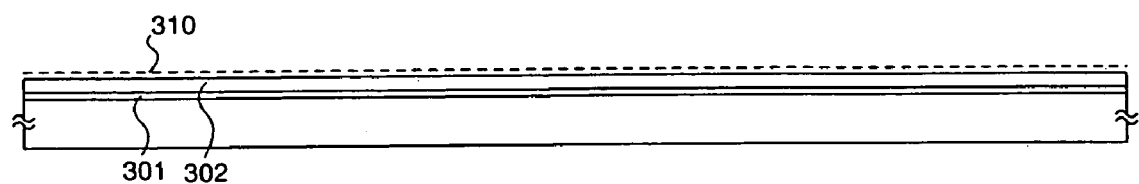
FIGS. 8A to 8D are diagrams showing a manufacturing method of a liquid crystal display device of the invention.
Figure 8B:
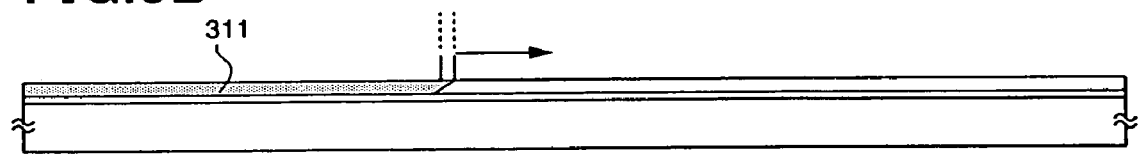

Next, as described above, laser light is irradiated by using a continuous wave laser to form a crystalline semiconductor 311 (FIG. 8B). It is assumed that the crystalline semiconductor 311 crystallized by using a catalyst element (Ni here) contains the catalyst element at a concentration of about $1 \times 10^{19}$ atoms/cm$^3$. Then, performed is gettering of the catalyst element included in the crystalline semiconductor 311.

Figure 8C:
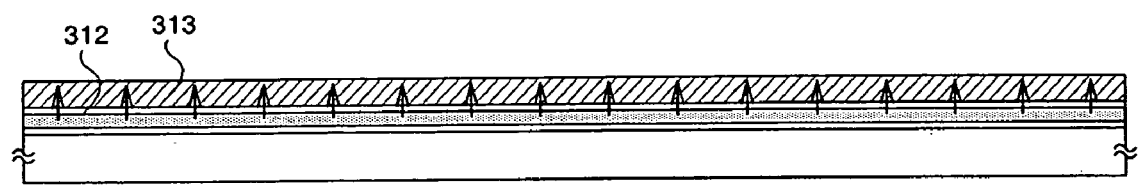

First, an oxide layer 312 is formed on a surface of the crystalline semiconductor 311 so as to have a thickness of approximately 1 to 10 nm (FIG. 8C). According to this, the crystalline semiconductor 311 can be prevented from being damaged by etching in the subsequent steps.

The oxide layer 312 can be formed in a known manner. For example, the surface of the crystalline semiconductor 311 may be oxidized by using ozone water, or an aqueous solution in which sulfuric acid, hydrochloric acid, nitric acid and the like are mixed with oxygenated water. The oxide layer 312 may also be formed by plasma processing in an atmosphere containing oxygen, heat treatment, irradiation of UV rays, and the like. Alternatively, an oxide layer may be formed separately by plasma CVD, sputtering, evaporation and the like to obtain the oxide layer 312.

Next, on the oxide layer 312, a semiconductor for gettering 313 containing a noble gas element at a concentration of $1 \times 10^{20}$ atoms/cm$^3$ or more is formed by sputtering so as to have a thickness of 25 to 250 nm. It is desirable that the semiconductor for gettering 313 have a lower film density than the crystalline semiconductor 311 in order to make the etch selectivity between these semiconductors higher. As the noble gas element, one or a plurality of elements selected from among helium (He), neon (Ne), argon (Ar), krypton (Kr), and xenon (Xe) are employed.

Subsequently, heat treatment is performed using furnace annealing or RTA for gettering. The furnace annealing is performed at a temperature of 450 to 600° C. for 0.5 to 12 hours in a nitrogen atmosphere. When using RTA, a lamp light source for heating is turned on for 1 to 60 seconds, preferably 30 to 60 seconds, and this operation is repeated 1 to 10 times, preferably 2 to 6 times. Although the light emission intensity of the lamp light source is set to be an arbitrary intensity, heat treatment is performed so that a semiconductor layer is instantaneously heated at 600 to 1000° C., preferably about 700 to 750° C.

According to the heat treatment, the catalytic element included in the crystalline semiconductor 311 is diffused and moved to the semiconductor for gettering 313 as shown by an arrow, and then gettered.

Then, the semiconductor for gettering 313 is selectively etched and removed. As etching methods, dry etching without using plasma by $ClF_3$, or wet etching by alkali solution containing hydrazine, and tetraethyl ammonium hydroxide ($(CH_3)_4NOH$) can be adopted. At this time, the oxide layer 312 prevents the crystalline semiconductor 311 from being etched.

Figure 8D:
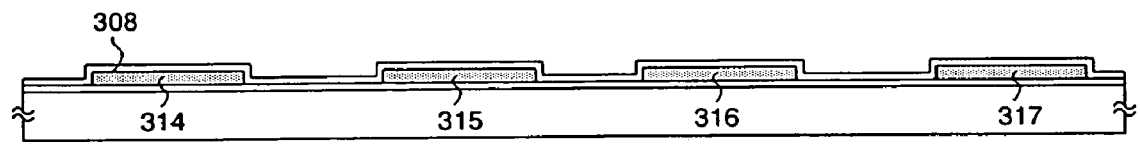

The oxide layer 312 is removed thereafter by hydrofluoric acid. The crystalline semiconductor 311 is patterned thereafter to form semiconductor layers 314 to 317 (FIG. 8D). Then, the gate insulating layer 308 is formed so as to cover the semiconductor layers 314 to 317. For the gate insulating layer 308, for example, an insulating layer containing silicon is formed by sputtering so as to have a thickness of 30 to 200 nm.

It is to be noted that the gettering step of the invention is not limited to the one shown in this embodiment. The catalytic element included in the semiconductor layer may be reduced by other method.

Figure 9A:
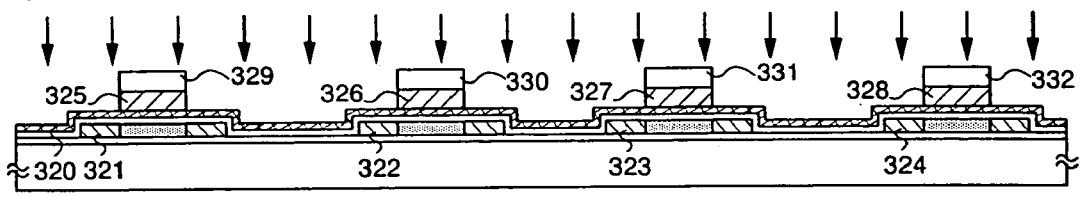
FIGS. 9A to 9E are diagrams showing a manufacturing method of a liquid crystal display device of the invention.

Next, a first conductive layer 320 having a thickness of 20 to 100 nm is formed on the gate insulating layer 308 (FIG. 9A). For forming the first conductive layer 320, a known conductive material, such as an element selected from among Ta, W, Ti, Mo, Al, Cu, Cr and Nd, and an alloy material or a compound material containing the above element as its main component, is used. Further, a semiconductor film typified by a polycrystalline silicon film doped with an impurity element such as phosphorous, or an AgPdCu alloy may also be used as the first conductive layer 320. Afterwards, a second conductive layer with a thickness of 100 to 400 nm and a silicon nitride layer with a thickness of 100 to 400 nm are laminated so as to cover the first conductive layer 320. Then, an insulating film such as a silicon oxide film and a silicon nitride film is patterned to form insulating layers 329 to 332. More specifically, the silicon oxide film is patterned by using a phosphoric acid based etchant whereas the silicon nitride film is patterned by using a hydrofluoric acid based etchant. Then, the second conductive layer is patterned with the insulating layers 329 to 332 as masks to form conductive layers 325 to 328.

A doping step is performed thereafter. In this step, an impurity element from group 5 imparting n-type conductivity, such as phosphorous (P) and arsenic (As) is added to the semiconductor layers 304 to 307 in a low concentration. In this case, the conductive layers 325 to 328 and the insulating layers 329 to 332 serve as masks against the impurity element imparting n-type conductivity, and impurity regions 321 to 324 are formed in a self-aligning manner. The impurity element imparting n-type conductivity is added in a concentration range of $1\times10^{18}$ to $1\times10^{20}$ atoms/cm$^3$.

Figure 9B:
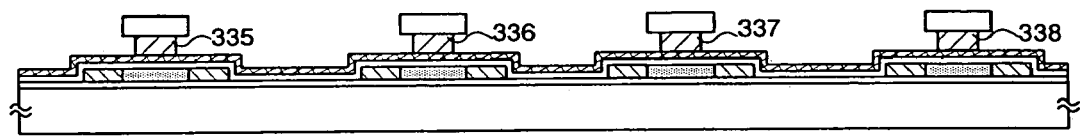
Figure 9C:
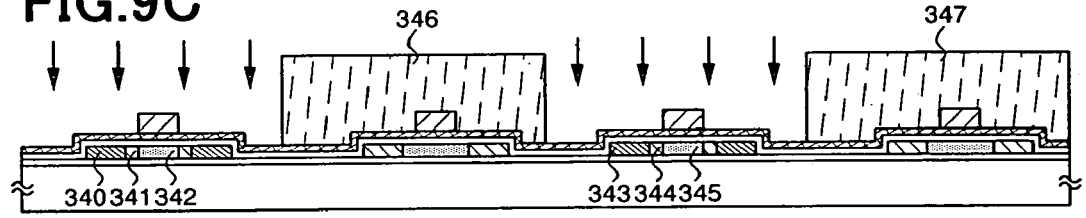

Subsequently, the conductive layers 325 to 328 are set back by a side anisotropic etching to form conductive layers 335 to 338 (FIG. 9B). The insulating layers 329 to 332 used as masks are removed thereafter by etching (FIG. 9C). Next, masks 346 and 347 formed of a resist are formed and a doping step is performed at a higher accelerator voltage than the aforementioned doping step. When the doping step is performed with the conductive layers 335 and 337 as masks against an impurity element, the impurity element imparting n-type conductivity is added to impurity regions 341 and 344 ($N^{31}$ regions, LDD regions) in a concentration range of $1\times10^{18}$ to $5\times10^{19}$ atoms/cm$^3$, and to impurity regions 340 and 343 in a concentration range of $1\times10^{19}$ to $5\times10^{21}$ atoms/cm$^3$. Further, channel portions 342 and 345 are formed at the same time.

Figure 9D:
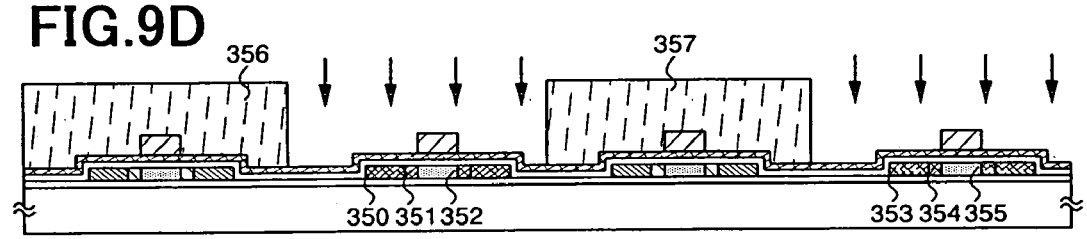

After removing the masks 346 and 347 formed of a resist, masks 356 and 357 formed of a resist are formed (FIG. 9D). Then, by a doping step, impurity regions doped with an impurity element imparting the opposite conductivity to the aforementioned conductivity are formed in semiconductor layers serving as an active layer of a p-channel TFT. In this step, an impurity element imparting p-type conductivity is added with the conductive layers 336 and 338 as masks against the impurity element. Thus, impurity regions 350 and 353 (P$^+$ regions), impurity regions 351 and 354 (P$^-$ regions), and channel portions 352 and 355 are formed in a self-aligning manner. In this case, a doping step is performed so that the impurity element imparting p-type conductivity has a concentration of $1\times10^{19}$ to $5\times10^{21}$ atoms/cm$^3$. It is to be noted that conditions of doping step are not limited to these described above, and a doping step may be repeated two or more times.

Figure 9E:
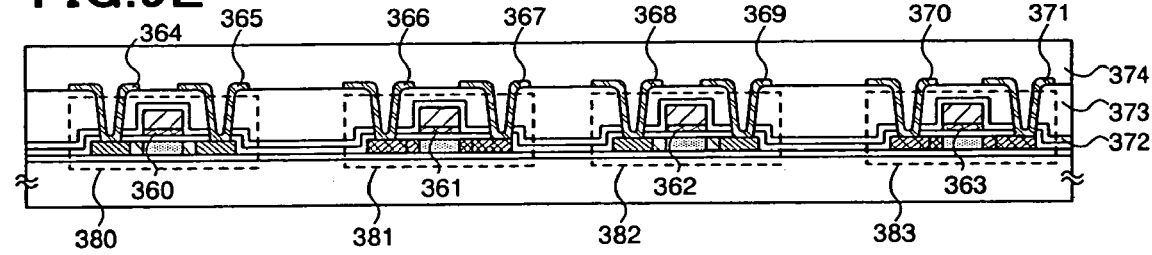

Subsequently, the masks 356 and 357 formed of a resist are removed, and the first conductive layer 320 is anisotropically etched with the conductive layers 325 to 328 as masks to form conductive layers 360 to 363 (FIG. 9E). By these steps, n-channel transistors 380 and 382 and p-channel transistors 381 and 383 can be formed on the same substrate.

An insulating layer 372 is formed as a protective layer. As the insulating layer 372, an insulating film containing silicon is formed by plasma CVD or sputtering so as to have a thickness of 100 to 200 nm, and a single structure or a laminated structure may be used. In this embodiment, a silicon oxynitride film with a thickness of 100 nm is formed by plasma CVD. Heat treatment may be performed afterwards in order to recover the crystallinity of the semiconductor layers or activate the impurity element added to the semiconductor layers.

Next, an organic insulating layer 373 is formed on the insulating layer 372. For the organic insulating layer 373, an organic insulating film such as a silicon oxide film, polyimide, polyamide, and acrylic is coated by SOG. Since the organic insulating layer 373 is provided with the intention of flattening the unevenness due to the TFTs formed on the substrate 300, a film having superior planarity is desirably used.

Subsequently, the insulating layer 372 and the organic insulating layer 373 are patterned by photolithography to form contact holes down to the impurity regions 340, 343, 350, and 353. Then, a conductive layer is formed of a conductive material and patterned to form wirings 364 to 371. Finally, an insulating layer 374 is formed as a protective layer to complete a liquid crystal display device as shown in the figure.

It is preferable that transistors used for a driver circuit and a functional circuit such as a CPU have an LDD structure or a GOLD structure, and it is also preferable to make transistors smaller for higher rate operation. Since the transistors 380 to 383 obtained by this embodiment have the LDD structure, they are suitable for a driver circuit required to operate at a high rate. Further, the gate insulating layer 308 has to be reduced in thickness as the size of transistors is reduced. In this embodiment, the doping step is performed while the gate insulating layer 308 is covered and protected with the first conductive layer 320, and thus this embodiment can provide a manufacturing method useful for reducing the size of transistors.

This embodiment can be implemented in combination with the aforementioned embodiment modes.

[Embodiment 2]

In this embodiment, a method for forming a bump in input and output terminals of a driver IC will be explained. The bump is provided for mounting a driver IC by COG, and can be formed by a known manner. An example of a forming method of a bump will be described with reference to FIGS. 10A to 10D.

Figure 10A:
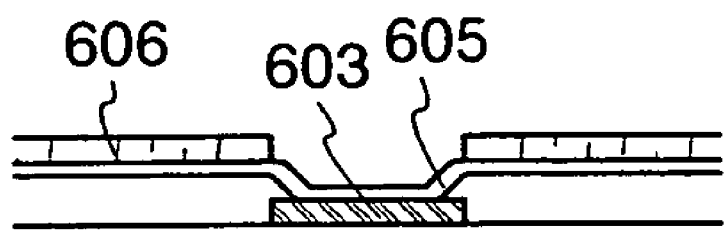
FIGS. 10A to 10D are diagrams showing a forming method of a bump in input and output terminals of a driver IC.

Input and output terminals 603 are formed on the same layer as a source or a drain wiring, and a barrier metal layer 605 in which Ti and Pd or Cr and Cu are laminated is formed on the input and output terminals 603 (FIG. 10A). The barrier metal layer 605 is formed by sputtering or evaporation. A resist mask 606 is formed thereafter.

Figure 10B:
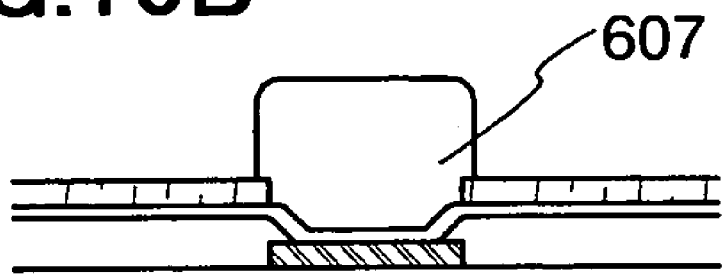
Figure 10C:
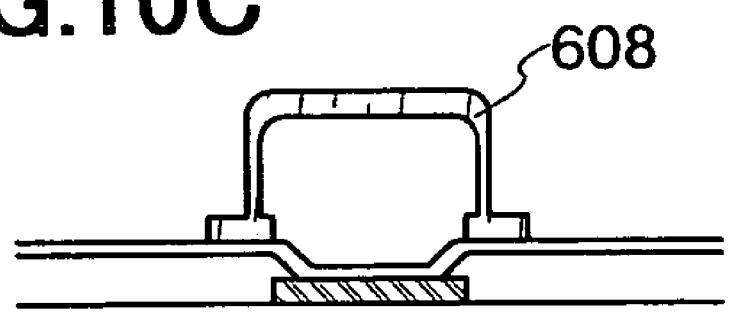

Then, a bump 607 formed of Au is formed by electroplating so as to have a thickness of 5 to 20 μm (FIG. 10B). After removing the resist mask 606 no longer required, a resist is applied over the bump 607 to form another resist mask 608 for etching the barrier metal layer 605 (FIG. 10C).

Figure 10D:
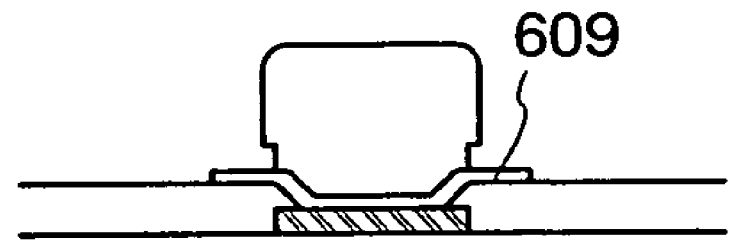

Since photolithography for forming the resist mask 608 is performed through the bump 607, high resolution can not be expected. Thus, the resist mask 608 is formed so as to cover the bump 607 and the periphery thereof. When the barrier metal layer 605 is etched by utilizing this resist mask 608, a barrier metal layer 609 can be obtained (FIG. 10D). Subsequently, heat treatment is performed at a temperature of 200 to 300° C. in order to enhance the adhesion between the bump 607 and the barrier metal layer 609. In such a manner, a driver IC having a bump in input and output terminals can be completed.

This embodiment can be implemented in combination with the aforementioned embodiment modes and embodiment.

[Embodiment 3]

In this embodiment, a method for mounting a driver IC will be described with reference to FIGS. 11A to 11E and FIG. 18. The driver IC may be mounted by connection using an anisotropic conductive material, by wire bonding, and the like. An example of the mounting methods is explained with reference to FIGS. 11A to 11E.

Figure 11A:
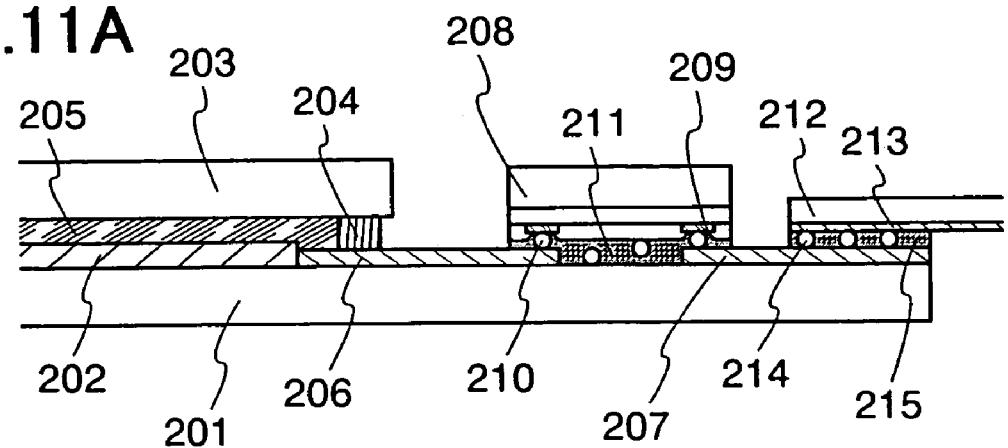
FIGS. 11A to 11E are diagrams showing a connection of a driver IC to a pixel region and an FPC.

Explanation is made on an example of a driver IC 208 mounted on a first substrate 201 by using an anisotropic conductive material (FIG. 11A). On the first substrate 201, formed are a pixel region 202, a lead wiring 206, and connect wiring and input and output terminals 207. The first substrate 201 is attached to a second substrate 203 with a sealing material 204, and a liquid crystal layer 205 is interposed therebetween.

An FPC 212 is attached to one side of the connect wiring and input and output terminals 207 by using an anisotropic conductive material. The anisotropic conductive material is formed of a resin 215 and conductive particles 214 having a surface plated with Au and the like and a diameter of tens to hundreds of μm. With the conductive particles 214, the connect wiring and input and output terminals 207 are electrically connected to a wiring 213 formed in the FPC 212. The driver IC 208 also is attached to the first substrate 201 with an anisotropic conductive material. With conductive particles 210 included in a resin 211, input and output terminals 209 of the driver IC 208 are electrically connected to either the lead wiring 206 or the connect wiring and input and output terminals 207.

Figure 11B:
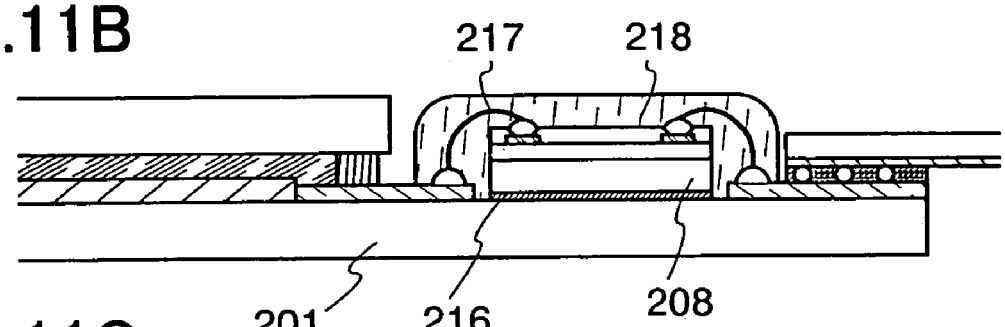
Figure 11C:
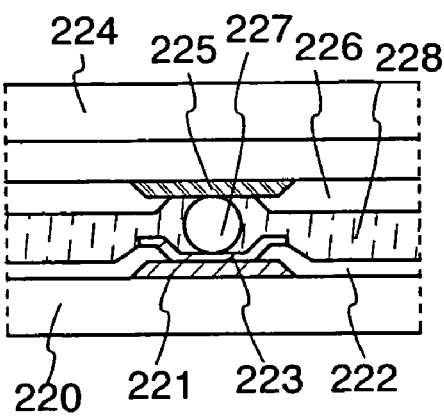

With reference to FIG. 11C, explanation is made on a mounting method of the driver IC 208 obtained in this manner. A driver IC 224 comprises input and output terminals 225, and a protective insulating layer 226 is formed at the periphery of the input and output terminals 225. A first conductive layer 221, a second conductive layer 223, and an insulating layer 222 are formed over a first substrate 220 as shown in the drawing. A lead wiring or a connect wiring is formed of the first conductive layer 221 and the second conductive layer 223.

These conductive layers 221 and 223 and the insulating layer 222 which are formed on the first substrate 220 can be achieved in the same step as that for forming a pixel TFT in a pixel region. For example, in the case where a pixel TFT is an inverted staggered TFT, the first conductive layer 221 is formed on the same layer as a gate electrode and formed of a material such as Ta, Cr, Ti, and Al. In general, a gate insulating layer is formed on the gate electrode, and the insulating layer 222 is formed on the same layer as the gate insulating layer. The second conductive layer 223 laminated on the first conductive layer 221 is formed of the same transparent conductive film as a pixel electrode, which allows the second conductive layer 223 to be connected well to the conductive particles 227. By optimizing the size and density of the conductive particles 227 included in the resin 228, the driver IC 224 is electrically connected to the first substrate 220.

Figure 11D:
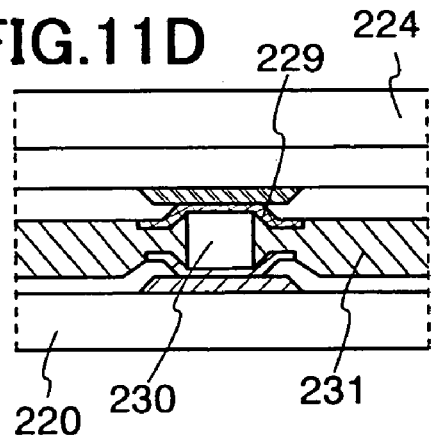

Next, a mounting method of the driver IC by COG using a contraction force of the resin is described (FIG. 11D). A barrier layer 229 formed of a material such as Ta and Ti is provided on the driver IC 224 side, and a bump 230 formed of Au with a thickness of about 20 μm is formed thereon by electroless plating and the like. Then, a photocurable insulating resin 231 is disposed between the driver IC 224 and the first substrate 220, and the electrodes are pressed onto each other by utilizing the contraction force of the resin, thereby making an electrical connection.

Figure 11E:
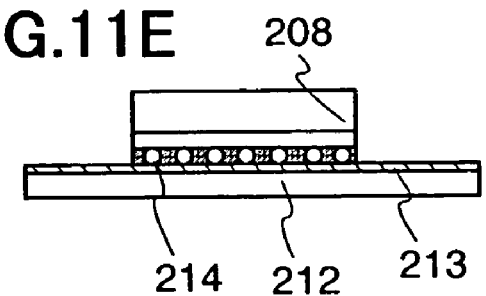

FIG. 11E shows an example of the driver IC 208 provided over the FPC 212 with the wiring 213 and the conductive particles 214 interposed therebetween. This structure is very useful for application to an electronic apparatus such as a portable information terminal whose housing is limited in size.

FIG. 11B shows another mounting method of the driver IC 208, in which the driver IC 208 is fixed on the first substrate 201 with an adhesive 216, and the input and output terminals of the driver IC 208 are connected to either the lead wiring or the connect wiring with an Au wire 217. A sealing resin 218 is used here for sealing. It is to be noted that a mounting method of the driver IC 208 is not exclusively limited, and a known method such as COG, wire bonding, or TAB may be used as well.

The thickness of the driver IC is set the same as that of the second substrate comprising a counter electrode. Accordingly, they can be much the same height, leading to reduction in thickness of a display device as a whole. Further, since each substrate is formed of the same material, thermal stress is not generated even when the temperature in the liquid crystal display device is changed, and thus characteristics of the circuit made up of TFTs are not damaged. Moreover, as shown in this embodiment, by mounting as a driver circuit a driver IC which is longer than an IC chip, the number of driver ICs to be mounted in a pixel region can be reduced.

It is to be noted that the driver IC 208 is made up of a group of thin film elements corresponding to driver circuits, which are formed on a substrate such as a glass substrate and a quartz substrate. The substrate is not necessarily required, and thus may be separated and removed after forming the group of elements. This operation will be briefly described hereinafter.

As a first method, a group of thin film elements and input and output terminals are firstly formed on a substrate such as a glass substrate and a quartz substrate. At this time, an adhesive layer is formed between the group of elements and the substrate. After electrically connecting a driver IC to a lead wiring with a bump, a two-sided tape is attached to the substrate and the substrate is separated by a physical means.

As a second method, a group of thin film elements and input and output terminals are firstly formed on a first substrate such as a glass substrate and a quartz substrate. An insulating layer is formed over the group of elements, an adhesive layer is formed thereon, a two-sided tape is attached to the adhesive layer, and a second substrate is attached on the two-sided tape. When the first substrate is separated, a base layer under the group of elements is exposed. Then, an adhesive layer is formed adjacent to the exposed base layer, and the adhesive layer is attached to a bump, a lead wiring and a connect wiring. Finally, the second substrate is separated.

Figure 18:
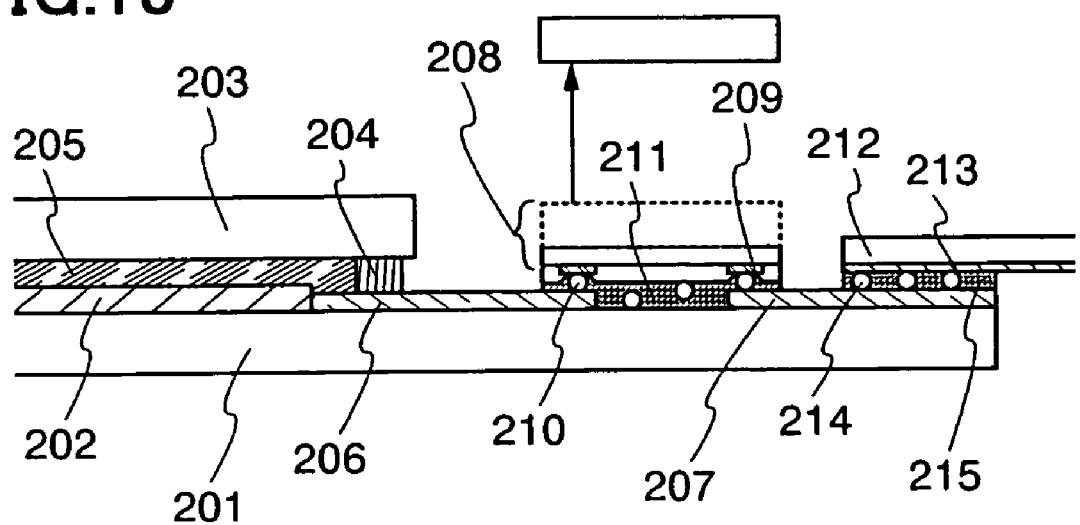
FIG. 18 is a cross sectional view of a liquid crystal display device of the invention.

As described above, a driver IC is not necessarily formed on a substrate, and the substrate may be separated and only a group of elements may be connected electrically. Such a driver IC is called a stick crystal, and a cross sectional view thereof is shown in FIG. 18. By separating a substrate forming a driver IC, the driver IC can be reduced in weight and mounted effectively in a portable information terminal and the like.

This embodiment can be implemented in combination with the aforementioned embodiment modes and embodiments.

[Embodiment 4]

In this embodiment, a configuration of a driver IC is explained with reference to the accompanied drawings.

Figure 12A:
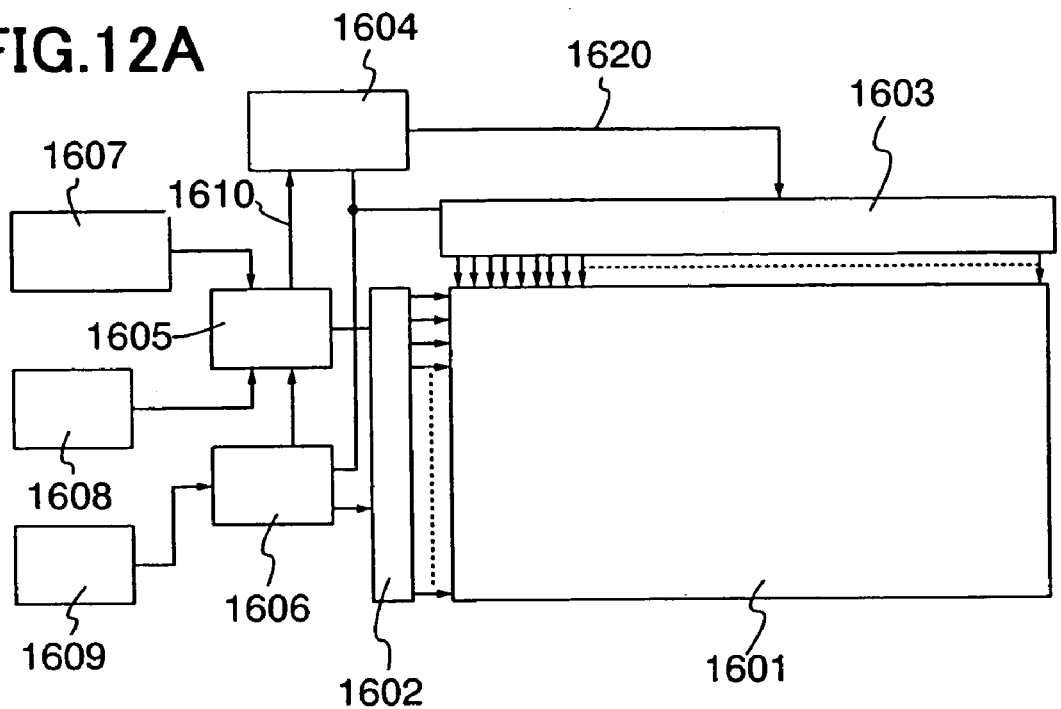
FIGS. 12A and 12B are diagrams showing a liquid crystal display device of the invention.

As set forth above, a driver IC is used as a driver circuit of a liquid crystal display device. FIG. 12A is a block diagram of such a display device. A pixel region 1601 comprises a plurality of scan lines and data lines, and either an active matrix type in which TFTs are provided or a passive matrix type may be adopted. In the periphery of the pixel region 1601, a scan line driver circuit 1602 and a data line driver circuit 1603 which correspond to a driver IC are disposed.

Clock signal and start pulse 1607 and a video signal 1608 are externally inputted to a control circuit 1605 for converting to an input specification of the driver IC, and converted to each timing specification. A power supply 1609 and a power supply circuit 1606 composed of an operation amplifier are externally provided. For the reduction in size of the display device, it is preferable that the control circuit 1605 and the power supply circuit 1606 are mounted by TAB.

The control circuit 1605 outputs a signal to each of the scan lines and the data lines. At this time, a digital input signal is divided into m signals in a signal divider circuit 1604 to be inputted to the data lines. The number of divisions m is a natural number of 2 or more, and practically, 2 to 16 is suitable. In this case, the number of a digital input signal line 1610 is different from that of a digital correction signal line 1620. For the signal divider circuit 1604, an IC chip may be mounted or a driver IC may be used as well.

Figure 12B:
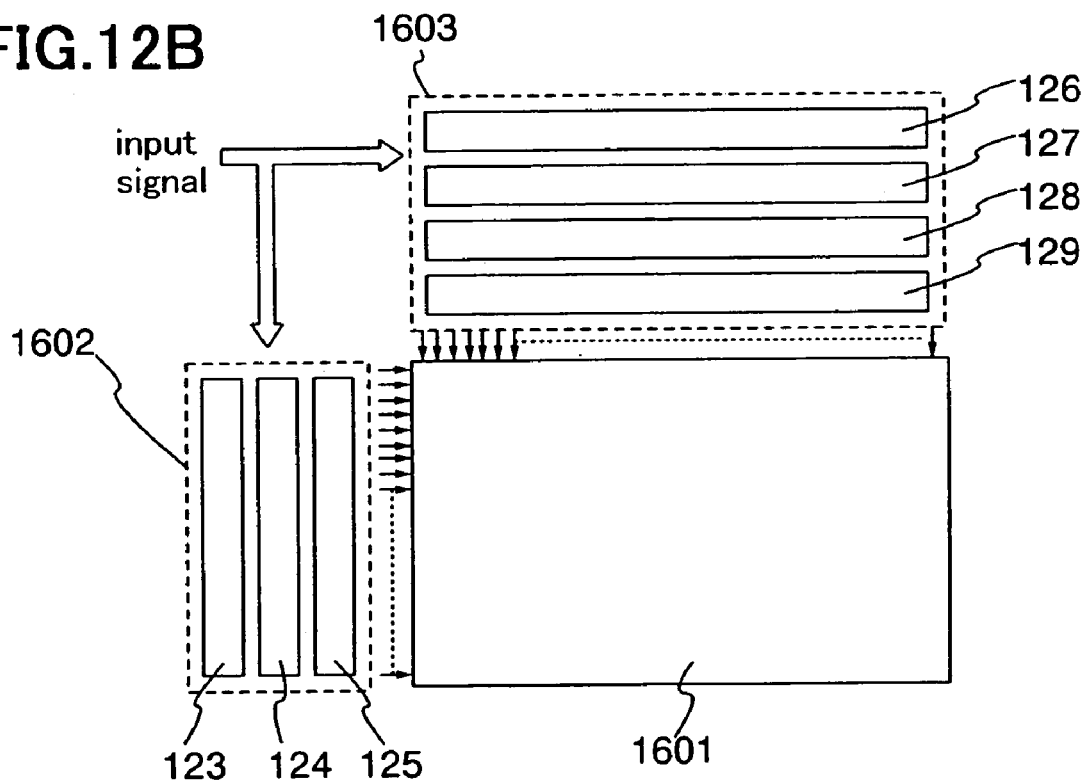

A circuit configuration of the driver IC in the scan line side differs from that in the data line side. FIG. 12B shows an example of such a configuration. The scan line driver circuit 1602 comprises a shift register circuit 123, a level shifting circuit 124, and a buffer circuit 125. On the other hand, the data line driver circuit 1603 comprises a shift register circuit 126, a latch circuit 127, a level shifting circuit 128, and a D/A converter circuit 129.

Figure 13:
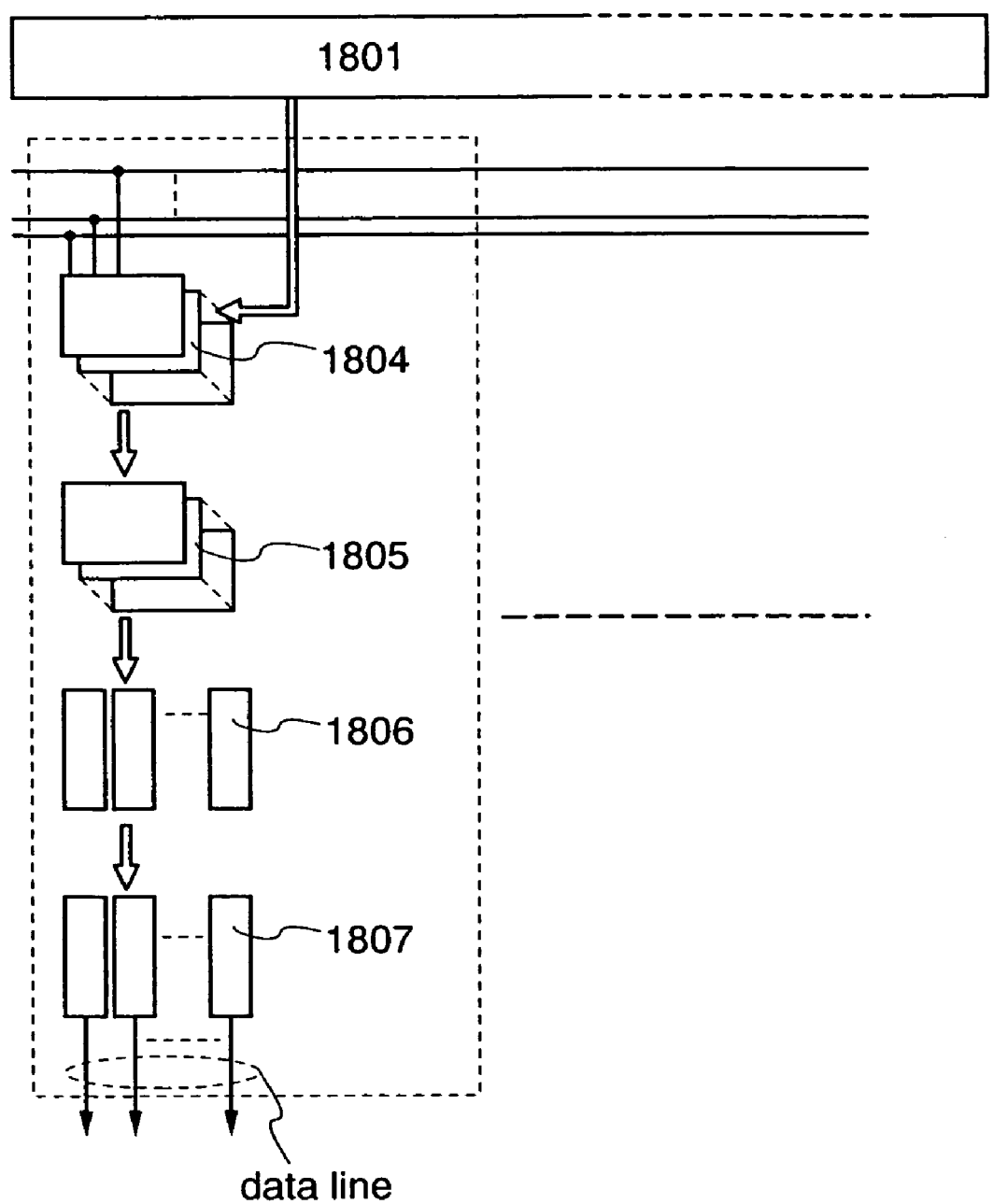
FIG. 13 is a diagram showing a driver IC.

Another example of a circuit configuration of the driver IC provided in the data line side is described with reference to FIG. 13. The data line driver circuit comprises a shift register circuit 1801, latch circuits 1804 and 1805, a level shifting circuit 1806, and a D/A converter circuit 1807 in this order from the input side.

This embodiment can be implemented in combination with the aforementioned embodiment modes and embodiments.

[Embodiment 5]

Described in this embodiment is a configuration of a pixel region formed on a substrate on which a driver IC is mounted. More specifically, explanation is made on a pixel region comprising a liquid crystal material interposed between a pair of electrodes.

Figure 14A:
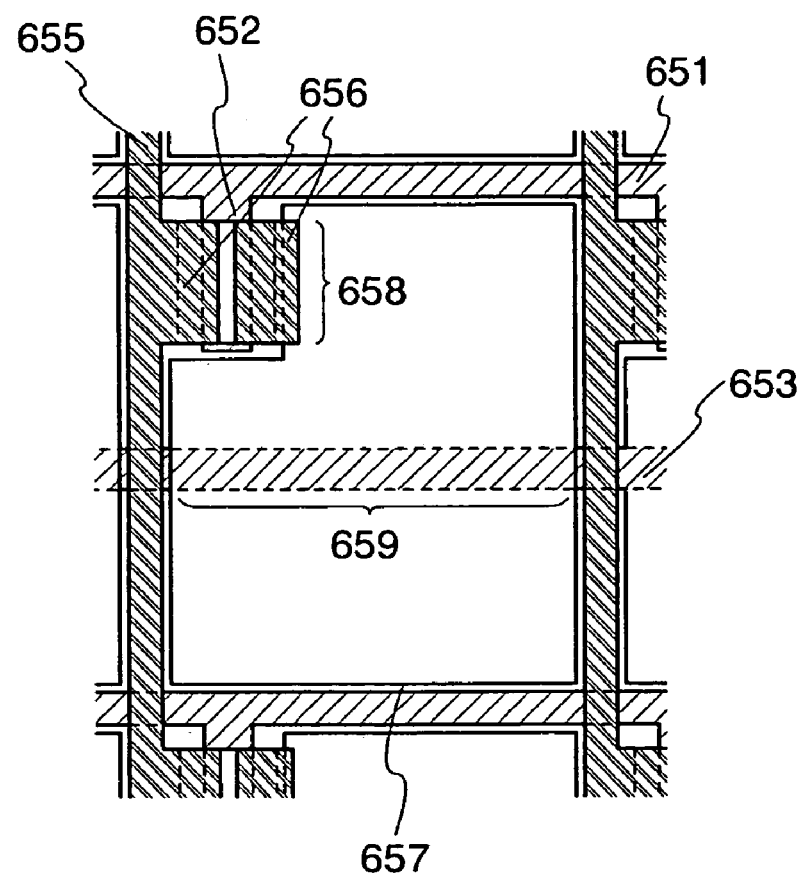
FIG. 14A is a top plan view of a pixel region and FIG. 14B is an equivalent circuit diagram of the pixel region.
Figure 14B:
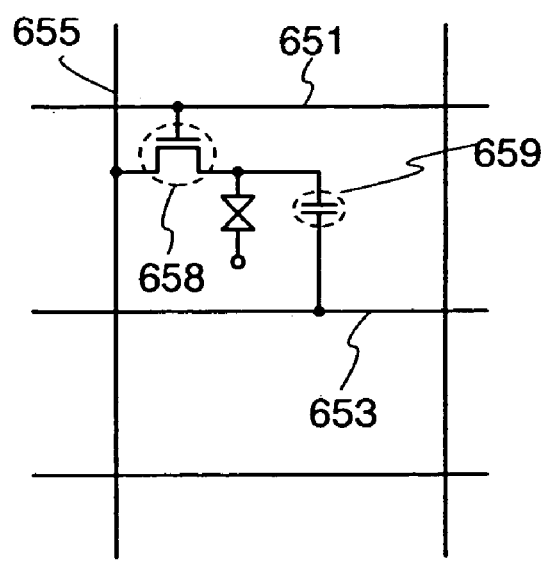

FIG. 14A is a top plan view (mask layout) of a pixel region comprising a liquid crystal layer. In the pixel region, a scan line 651 and a data line 655 intersect with each other and a pixel TFT 658 is provided at the intersection. One of source and drain electrodes 656 of the bottom gate pixel TFT 658 is connected to the data line 655, and the other is connected to a pixel electrode 657. A storage capacitor 659 required for driving the liquid crystal is provided between a capacitor wiring 653 formed on the same layer as a gate electrode 652 and the pixel electrode 657 through the intermediary of an insulating layer formed on the same layer as a gate insulating layer. FIG. 14B is an equivalent circuit of the pixel region.

Figure 15A:
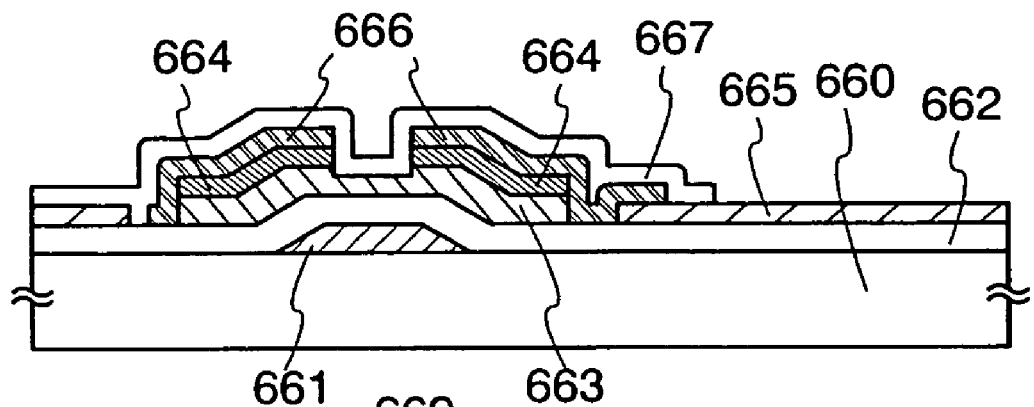
FIGS. 15A to 15C are cross sectional views of a transistor provided in a pixel region.

As for a structure of the pixel TFT, for example, a channel etched bottom gate TFT shown in FIG. 15A can be used but not exclusively limited to this. In such a TFT, a gate electrode 661 formed of Ta, Cr, Mo, or Al is formed on a substrate 660, and a gate insulating layer 662 formed of a silicon nitride film, a silicon oxide film, a tantalum oxide film and the like is formed over the gate electrode 661. Then, a semiconductor layer 663 having an amorphous structure is formed thereon so as to be island shaped and overlapped partly with the gate electrode 661. The amorphous semiconductor layer 663 is typically formed of amorphous silicon which is deposited by plasma CVD to have a thickness of 100 to 250 nm. A semiconductor layer 664 doped with an impurity element imparting n-type or p-type conductivity is provided so as to be overlapped with the amorphous semiconductor layer 663.

Subsequently, a pixel electrode 665 is formed by using a transparent conductive film. Specifically, the transparent conductive film is formed of a material such as indium oxide tin ($In_2O_3$: $SnO_2$, ITO) or zinc oxide (ZnO), a compound of indium oxide tin and zinc oxide, and zinc oxide added with gallium oxide ($Ga_2O_3$). Then, source and drain electrodes 666 are formed of a material such as Cr, Ti, and Ta. The semiconductor layer 664 doped with n-type or p-type impurity is etched with the source and drain electrodes 666 as masks and divided into two regions. This etching step can not be selectively performed to the amorphous semiconductor layer 663, and thus a part of the same is etched to be removed. Finally, a protective layer 667 is formed of silicon nitride, silicon oxide and the like to complete the pixel TFT.

Figure 15B:
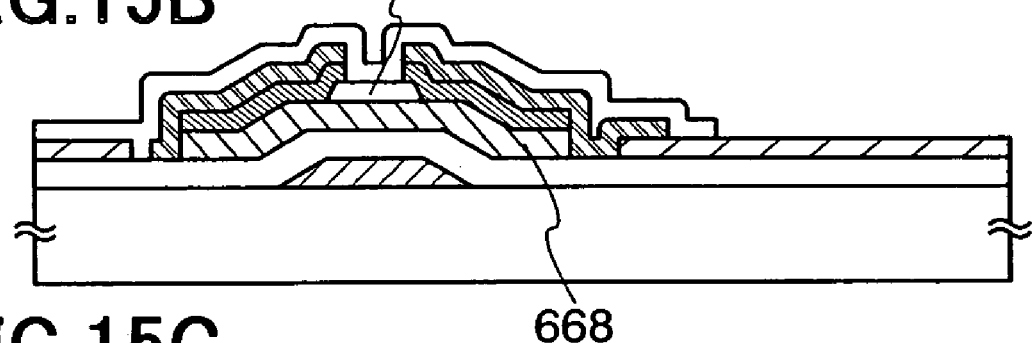

FIG. 15B shows a structure of a channel protective TFT, in which a channel protective layer 669 formed of silicon nitride and the like is formed on an amorphous semiconductor layer 668 so that the amorphous semiconductor layer 668 is not etched during an etching step for forming source and drain regions.

Figure 15C:
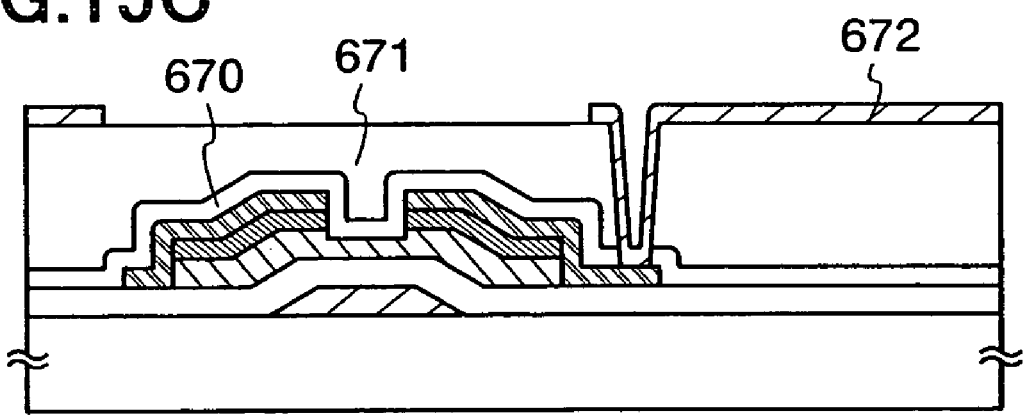

FIG. 15C shows a structure in which a planarizing layer 671 formed of an organic resin material such as acrylic is formed over a protective layer 670, and a pixel electrode 672 is formed thereon. The pixel electrode 672 is connected to a pixel TFT through a contact hole, which allows an opening ratio to be increased. Further, planarization of the surface enables the disorder of orientation of the liquid crystal such as disclination to be reduced.

Although a bottom gate TFT is used as a pixel TFT in this embodiment, a top gate TFT may also be used without any problem. A bottom gate TFT is used in many cases in view of characteristics of TFT and production cost. However, the driver IC of the invention is applicable to the one formed of an MIM element in which a pixel region is formed with a combination of tantalum and tantalum oxide.

In FIGS. 14A and 14B, an amorphous semiconductor element is used in a pixel region, though an organic semiconductor element may be used as well. A semiconductor element formed of an organic semiconductor is described hereinafter.

Figure 16A:
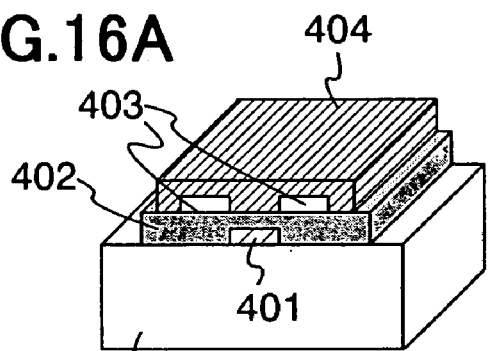
FIGS. 16A to 16D are cross sectional views of a transistor provided in a pixel region.
Figure 16B:
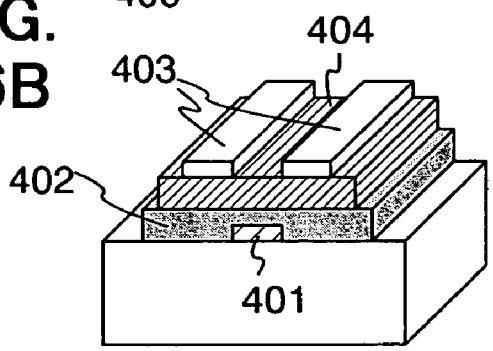
Figure 16C:
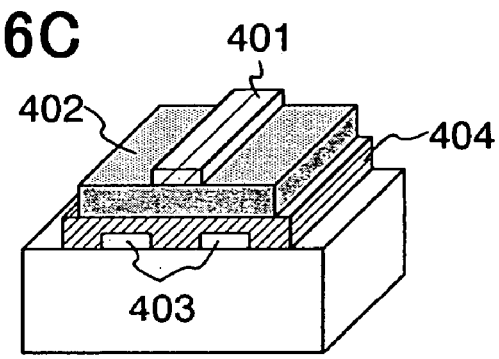

An organic semiconductor element is divided into three types of TFTs: planar TFT (FIG. 16A), inverted staggered TFT (FIG. 16B), and staggered TFT (FIG. 16C). In a planar TFT, a gate electrode 401, a gate insulating layer 402, source and drain electrodes 403, and an organic semiconductor 404 are laminated in this order over a substrate 400. In an inverted staggered TFT, the gate electrode 401, the gate insulating layer 402, the organic semiconductor 404, and the source and drain electrodes 403 are laminated in this order over the substrate 400. In a staggered TFT, the source and drain electrodes 403, the organic semiconductor 404, the gate insulating layer 402, and the gate electrode 401 are laminated in this order over the substrate 400. Either kind of TFT can be used for a pixel region, however, it is preferable to use a high dielectric material, $Ta_2O_5$, for the gate insulating layer 402 of the organic semiconductor element (organic transistor) described above. This is because the dielectric constant of $Ta_2O_5$ is approximately 24, which is approximately six times higher than that of silicon oxide used in general. When a relative dielectric constant is high, much charge is induced in a channel layer leading to an increase in on-current. Further, it is also preferable to use for a channel layer pentacene which is a material having a high carrier mobility, since the higher the carrier mobility is, the larger the on-current is.

Figure 16D:
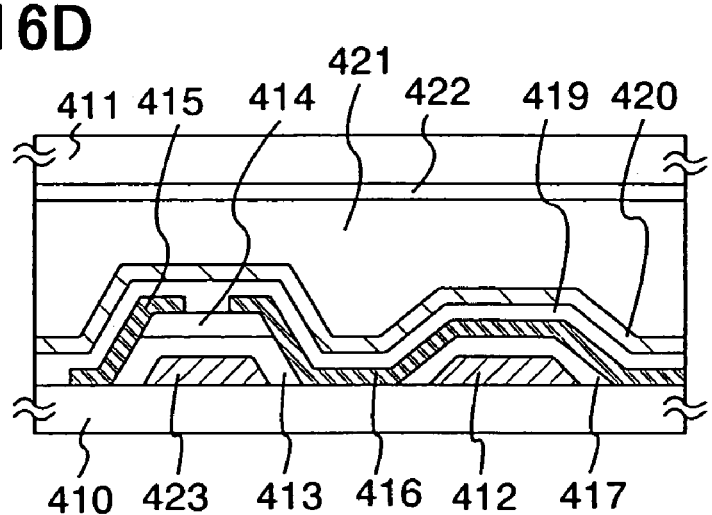

Next, a cross sectional structure of a liquid crystal display device using an organic transistor is described with reference to FIG. 16D. On a substrate 410, gate electrodes 423 and 412, gate insulating layers 413 and 417, a pentacene layer 414 with a thickness of about 100 nm, Al layers 415 and 416 with a thickness of about 2 to 3 nm, a polyvinyl alcohol 419, and a UV curable resin 426 are laminated in this order. Further, an ITO layer 422 is formed adjacent to a substrate 411. Then, after attaching the substrate 410 having these thin films to the substrate 411, a liquid crystal layer 421 is injected to complete the liquid crystal display device.

This embodiment can be implemented in combination with the aforementioned embodiment modes and embodiments.

[Embodiment 6]

In this embodiment, a method for mounting a display device including a driver IC to an electronic apparatus will be explained with reference to FIG. 17.

Figure 17:
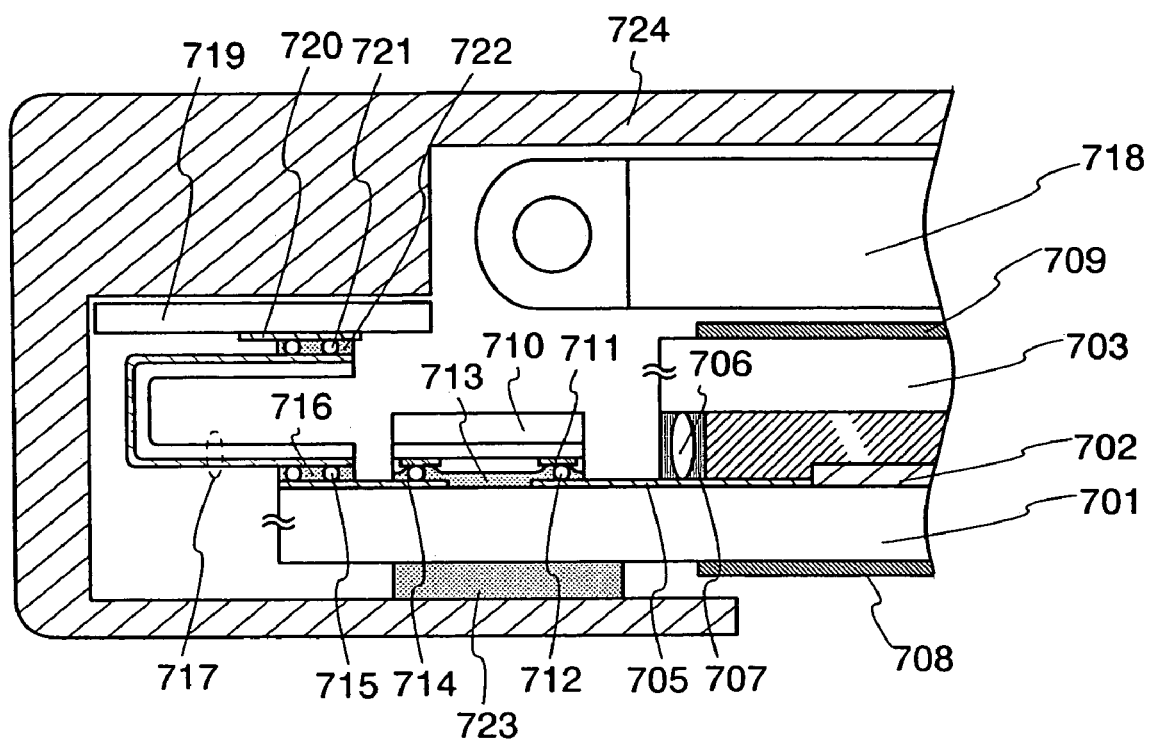
FIG. 17 is a diagram showing an electronic apparatus provided with a liquid crystal display device of the invention.

In a display device shown in FIG. 17, a driver IC 710 is provided at the edge of a substrate 701 on which a pixel region 702 is formed. The substrate 701 is attached to a counter substrate 703 with a sealing material 707 containing a spacer 706. Further, polarizers 708 and 709 are provided, the substrate 701 is fixed to a housing 724 with a connecting member 723.

Input and output terminals 711 of the driver IC 710 are connected to input and output wirings 705 and 714 on the substrate 701 with a resin 713 including conductive particles 712. One side of the input and output wirings 714 is attached to a flexible printed circuit 717 (FPC 717) with a resin 716 including conductive particles 715. Further, the FPC 717 is connected to input and output terminals 720 on a printed substrate 719 comprising a signal processing circuit, an amplifier circuit and a power supply circuit in the same manner (with a resin 722 including conductive particles 721), and transmits a signal required for displaying an image to the display device comprising the driver IC. In the case where the display device is a transmissive liquid crystal display device, a light source and a light guide are provided in the side of the counter substrate 703, and a back light 718 is provided as well.

The aforementioned mounting method of a display device is just an example, and can be modified appropriately in accordance with the type of electronic apparatus. The invention can be applied to various types of electronic apparatuses such as a video camera, a digital camera, an audio reproducing device such as a goggle type display, a notebook personal computer, a game machine, a portable information terminal (mobile computer, mobile phone and the like), and an image reproducing device provided with a recording medium such as a home video game machine. Specific examples of these electronic apparatuses are shown in FIGS. 19A to 19A and FIGS. 20A to 20D.

Figure 19A:
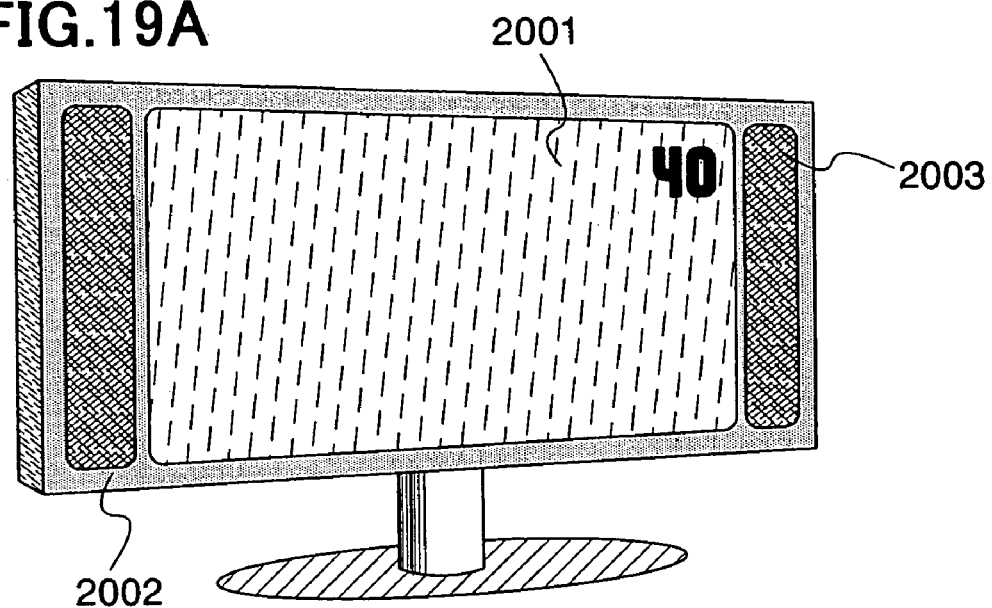
FIGS. 19A to 19C are views of electronic apparatuses to which the invention can be applied.
Figure 19B:
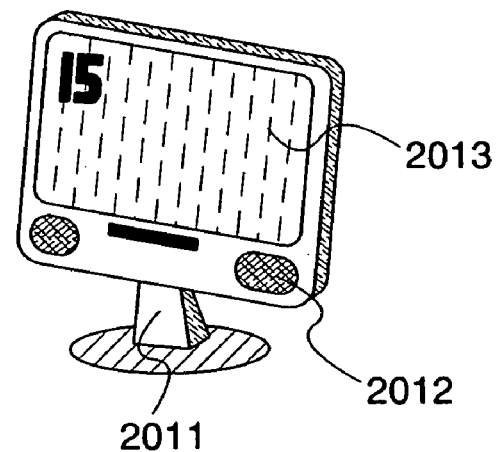
Figure 19C:
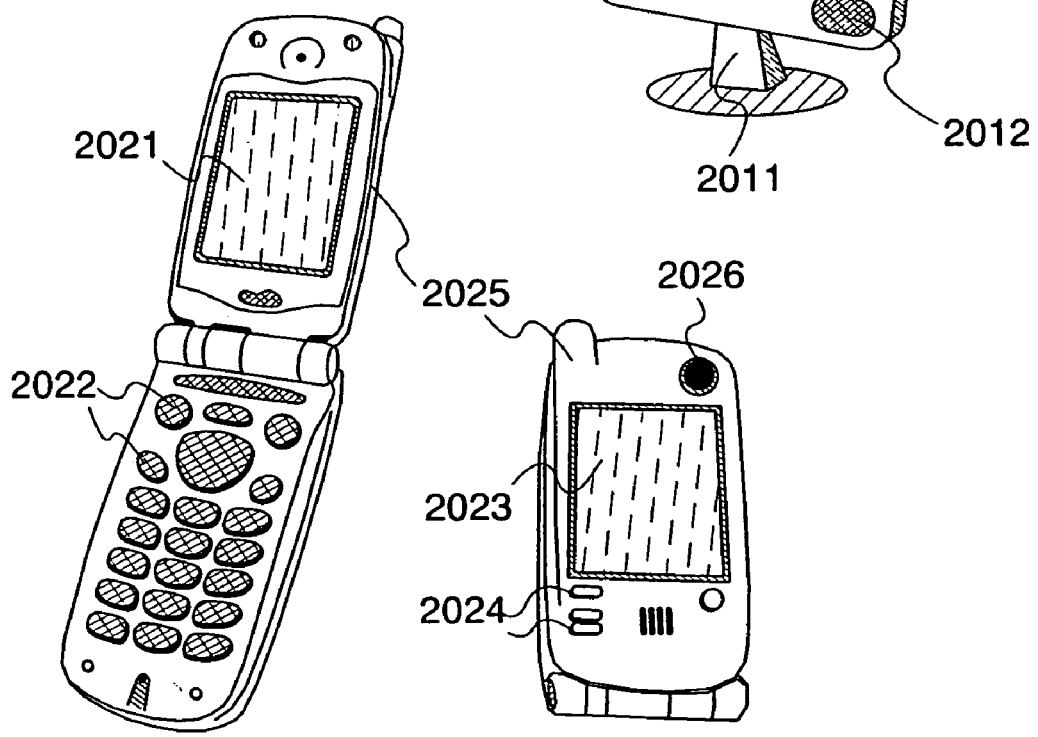

FIG. 19A shows a large-sized (about 40 inches) liquid crystal television which includes a display portion 2001, a housing 2002, an audio output portion 2003 and the like. FIG. 19B shows a liquid crystal monitor which includes a housing 2011, an audio output portion 2012, a display portion 2013 and the like. FIG. 19C shows a flip phone which includes a first display surface 2021, operation switches 2022, a second display surface 2023, operation switches 2024, a housing 2025, a lens 2026 and the like. In these electronic apparatuses, the invention can be applied to the display portions 2001 and 2013, the first display surface 2021, and the second display surface 2023.

Figure 20A:
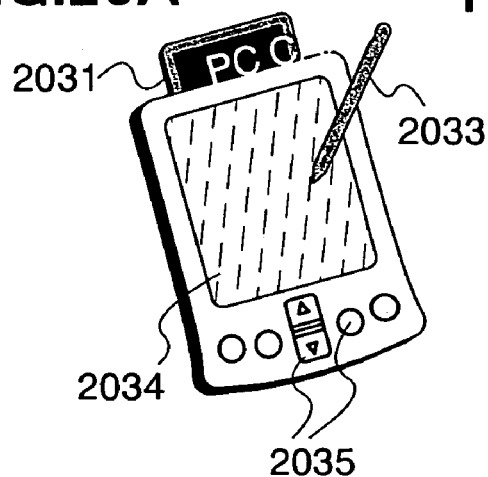
FIGS. 20A to 20D are views of electronic apparatuses to which the invention can be applied.
Figure 20B:
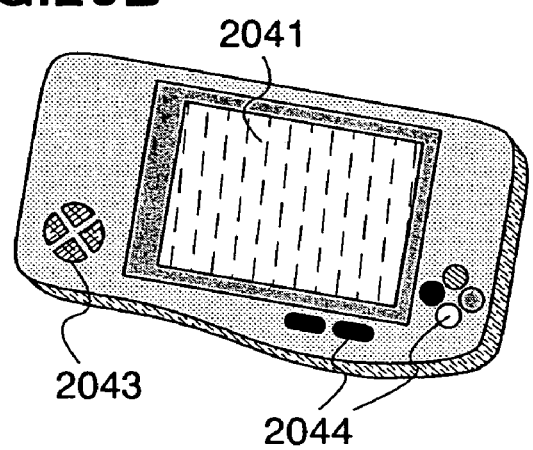
Figure 20C:
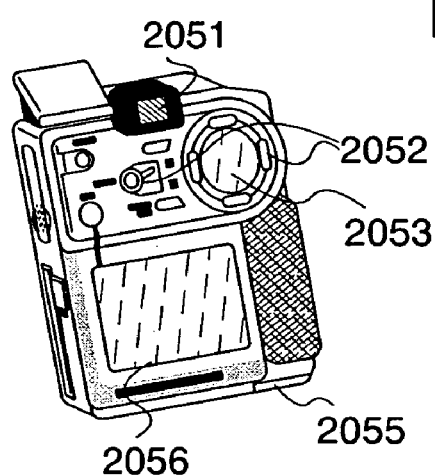
Figure 20D:
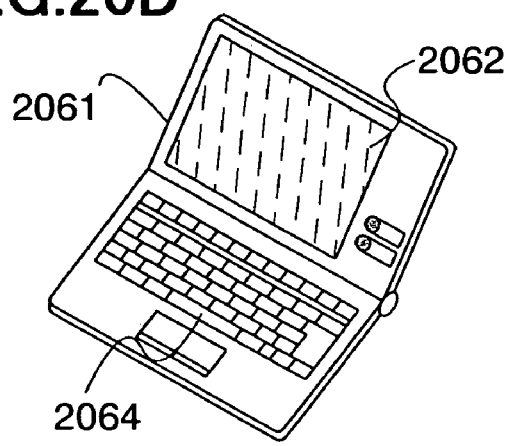

FIG. 20A shows a PDA (Personal Digital Assistant) which includes an external interface 2031, a stylus 2033, a display portion 2034, operation switches 2035 and the like. FIG. 20B shows a portable game machine which includes a display portion 2041, operation switches 2043 and 2044 and the like. FIG. 20C shows a digital video camera which includes an eye contacting part 2051, operation switches 2052, display portions 2053 and 2056, a battery 2055 and the like. FIG. 20D shows a notebook personal computer which includes a housing 2061, a display portion 2062, a keyboard 2064 and the like. In these electronic apparatuses, the invention can be applied to the display portions 2034, 2041, 2053, 2056, and 2062.

This embodiment can be implemented in combination with the aforementioned embodiment modes and embodiments.

[Embodiment 7]

In the case where an image is displayed with multiple gray scale in a display device, either an analog driving method or a digital driving method is used. These methods are different in controlling a display element between a light emitting state and a non-light emitting state. In the analog driving method, gray scale is achieved by controlling a current flowing in a display element. Meanwhile, in the digital driving method, gray scale is achieved in a combination of two states of a display element: on-state (in which the luminance is approximately 100%) and off-state (in which the luminance is approximately 0%). In the case of using the digital driving method, an image can be displayed with only two levels in accordance with the on-state and the off-state, therefore, the digital driving method is performed in combination with another method in order to achieve multiple gray scale, and area gray scale or time gray scale is used for example.

Either the analog driving method or the digital driving method can be applied to the display device of the invention, whether a liquid crystal panel or a light emitting panel is used, and either area gray scale or time gray scale can be applied in the case of using the digital driving method. Alternatively, another driving method can also be applied such as an overdrive method in which a liquid crystal response is improved.

As set forth above, either an active matrix type or a passive matrix type can be adopted to the display device of the invention. However, in the case of using an active matrix display device with a light emitting panel in which a current-driven element is used for a light emitting element, the analog driving method is preferably adopted when there is little variation in characteristics of transistors in pixels. On the other hand, when the digital driving method is adopted in the active matrix display device, it is preferable to supply a constant current to a light emitting element by operating a driving transistor in a saturation region. In other words, now that a current-driven element is used, it is desirable to form a pixel so as to supply a constant current to the light emitting element, and to select whether the analog driving method or the digital driving method in accordance with the pixel configuration.

In this embodiment, time gray scale is briefly described among the aforementioned driving methods. Generally in a display device such as a liquid crystal display device and a light emitting device, a frame frequency is about 60 Hz, that is, rewriting of a display screen is performed approximately 60 times per second. According to this, screen flicker can be reduced enough to be imperceptible by the human eye. A period during which one rewriting is performed is referred to as a frame period, and one frame period is divided into a plurality of subframe periods in time gray scale. The number of divisions is equal to the number of bits in many cases, and such a case is explained here for simplicity. Described below is an example of 3-bit, namely a case of dividing a frame period into three subframe periods $SF_1$ to $SF_3$.

Each subframe period comprises an address period Ta and a sustain period Ts. The address period is a period during which a video signal is written to a pixel, and the length of the address period is the same in each subframe period. The sustain period is a period during which a light emitting element emits light in accordance with a video signal written to a pixel during the address period. In subframe periods $SF_1$ to $SF_3$, the ratio of the length of the sustain periods $Ts_1 : Ts_2 : Ts_3$ is 4:2:1. That is, when displaying an image with n-bit, the ratio of the length of n sustain periods is $2^{(n-1)} : 2^{(n-2)} : \ldots : 2^1 : 2^0$. Accordingly, the length of a light emitting period per frame period is determined by the length of sustain periods during which a light emitting element emits light, and thereby an image can be displayed with time gray scale.

In other words, by selecting either a light emitting state or a non-light emitting state in each of the sustain periods $Ts_1$ to $Ts_3$, the total light emitting time varies and thus 8-level gray scale is achieved, in which the luminance is 0%, 14%, 28%, 43%, 57%, 71%, 86%, or 100%. For example, when light is emitted in $Ts_1$ and no light is emitted in $Ts_2$ and $Ts_3$, the luminance is 57%, whereas 71% when light is emitted in $Ts_1$ and $Ts_3$ and no light is emitted in $Ts_2$. That is, light is emitted according to the total sustain periods in time gray scale.

It is to be noted that when the number of subframe periods is increased, the levels of gray scale can be increased. Further, the subframe periods are not necessarily arranged from the most significant bit to the least significant bit, but may be arranged in a random order in one frame period. Moreover, the order of subframe periods may vary in each frame period.

This embodiment can be implemented in combination with the aforementioned embodiment modes and embodiments.

[Embodiment 8]

Although the laser crystallization is performed by using continuous wave laser light in Embodiment 3, the invention is not limited to this and laser crystallization may also be performed by using pulsed laser light. This is because crystal grain which is sequentially grown in the scan direction can be obtained even with a pulsed energy beam (pulsed beam) by oscillating laser light at a frequency which allows pulsed laser light to be irradiated before a semiconductor film dissolved by the preceding laser light becomes solidified. That is, the pulsed laser light provides the same effects as the continuous laser light. Accordingly, it is desirable to use a pulsed beam in which the lower limit of the oscillation frequency is determined so that the oscillation cycle of pulsed laser is shorter than the period between the diffusion and the complete solidification of a semiconductor film. Specifically, the oscillation frequency of a pulsed laser is equal to or more than 10 MHz, and more preferably in the range of 60 to 100 MHz, which is a much higher frequency range than that of tens to hundreds of Hz of a normally used pulsed laser. According to the aforementioned frequency range, pulsed laser light can be irradiated before a semiconductor film dissolved by the preceding laser light becomes solidified. Therefore, differently from the case of using pulsed laser light with the conventional oscillation frequency, solid-liquid interface can be sequentially moved in a semiconductor film, thereby forming a semiconductor film having crystal grains which are sequentially grown in the scan direction. More specifically, a group of crystal grains each having a grain width of 10 to 30 μm in the scan direction and 1 to 5 μm in the direction perpendicular to the scan direction can be obtained, which is much the same as a crystal grain formed with a continuous wave laser. Thus, single crystal grains extending along the scan line are formed, and a semiconductor film having few crystal grain boundary at least in the channel length of a TFT can be achieved.

As a pulsed laser, a laser capable of being oscillated at the aforementioned frequency, such as an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, and a Ti:sapphire laser, a copper steam laser, and a gold steam laser, can be used.

This application is based on Japanese Patent Application serial no. 2003-133631 filed in Japan Patent Office on 12th, May, 2003, the contents of which are hereby incorporated by reference.

Although the present invention has been fully described by way of Embodiment Modes and Embodiments with reference to the accompanying drawings, it is to be understood that various changes and modifications will be apparent to those skilled in the art. Therefore, unless otherwise such changes and modifications depart from the scope of the present invention hereinafter defined, they should be constructed as being included therein.

What is claimed is:

1. A semiconductor device comprising:
a first substrate having a first thin film transistor including an organic semiconductor for a channel portion adjacent to a region in which a scan line and a data line intersect with each other with an insulating layer interposed therebetween;
a second substrate having a counter electrode; and
a third substrate having a second thin film transistor including a crystalline semiconductor for a channel portion,
wherein the crystalline semiconductor comprises a grain boundary which extends along a flow of electrons or holes in the second thin film transistor;
wherein the first substrate and the second substrate are attached to each other so that the first substrate is exposed;
wherein the third substrate is attached to an exposed region over the first substrate;
wherein a first region for forming the second thin film transistor and a second region for forming an input terminal and an output terminal are formed over the third substrate; and
wherein the short side length of the third substrate is in the range of 1 to 6 mm, and the short side length of the first region is in the range of 0.5 to 1 mm.

2. A semiconductor device according to claim 1, wherein the pitch of either or both of the input terminal and the output terminal is the same as that of either the scan line or the data line.

3. A semiconductor device according to claim 1, wherein the pitch of either or both of the input terminal and the output terminal is the same as that of either the scan line or the data line, and the pitch is 30 to 150 µm.

4. A semiconductor device according to claim 1, wherein the long side of the third substrate is of the same length as the short side or the long side of a pixel region in which the first thin film transistor is disposed.

5. A semiconductor device according to claim 1, wherein the first to the third substrates are formed of the same material.

6. A semiconductor device according to claim 1, wherein the first to the third substrates are formed of glass or quartz.

7. A semiconductor device according to claim 1, wherein the crystalline semiconductor is formed by irradiating laser light, and an oscillator for generating the laser light is at least one kind of laser selected from among a YAG laser, a $YVO_4$ laser, a YLF laser, a $YAIO_3$ laser, a glass laser, a ruby laser, an alexandrite laser, a Ti:sapphire laser, an $Nd^{3+}:Y_2O_5$ laser, an excimer laser, an Ar laser, and a Kr laser of continuous wave.

8. A semiconductor device according to claim 1, wherein the first thin film transistor is a bottom gate thin film transistor and the second thin film transistor is a top gate thin film transistor.

* * * * *